United States Patent
Hartig

(10) Patent No.: US 9,812,296 B2
(45) Date of Patent: Nov. 7, 2017

(54) SPUTTERING APPARATUS INCLUDING GAS DISTRIBUTION SYSTEM

(71) Applicant: Cardinal CG Company, Eden Prairie, MN (US)

(72) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

(21) Appl. No.: 15/013,120

(22) Filed: Feb. 2, 2016

(65) Prior Publication Data

US 2016/0233056 A1    Aug. 11, 2016

Related U.S. Application Data

(60) Provisional application No. 62/111,318, filed on Feb. 3, 2015.

(51) Int. Cl.
*H01J 37/34* (2006.01)
*H01J 37/32* (2006.01)
(Continued)

(52) U.S. Cl.
CPC ...... *H01J 37/3244* (2013.01); *C23C 14/0063* (2013.01); *C23C 14/35* (2013.01);
(Continued)

(58) Field of Classification Search
CPC .. H01J 37/3464; H01J 37/347; H01J 37/3244; H01J 37/32449; H01J 37/3405;
(Continued)

(56) References Cited

U.S. PATENT DOCUMENTS

| | | | |
|---|---|---|---|
| 4,166,018 A | | 8/1979 | Chapin |
| 4,425,218 A | * | 1/1984 | Robinson ............ C23C 14/0063 |
| | | | 204/192.12 |

(Continued)

FOREIGN PATENT DOCUMENTS

| | | |
|---|---|---|
| DE | 102013108994 A1 | 6/2014 |
| GB | 2277327 A | 10/1994 |

(Continued)

OTHER PUBLICATIONS

Machine Translation JP05117847.*

(Continued)

*Primary Examiner* — Michael Band
(74) *Attorney, Agent, or Firm* — Fredrikson & Byron, P.A.

(57) ABSTRACT

Some embodiments provide a magnetron sputtering apparatus including a vacuum chamber within which a controlled environment may be established, a target comprising one or more sputterable materials, wherein the target includes a racetrack-shaped sputtering zone that extends longitudinally along a longitudinal axis and comprises a straightaway area sandwiched between a first turnaround area and a second turnaround area, a gas distribution system that supplies a first gas mixture to the first turnaround area and/or the second turnaround area and supplies a second gas mixture to the straightaway area, wherein the first gas mixture reduces a sputtering rate relative to the second gas mixture. In some cases, the first gas mixture includes inert gas having a first atomic weight and the second gas mixture includes inert gas having a second atomic weight, wherein the second atomic weight is heavier than the first atomic weight.

13 Claims, 27 Drawing Sheets

(51) Int. Cl.
*C23C 14/00* (2006.01)
*C23C 14/35* (2006.01)

(52) U.S. Cl.
CPC .... *H01J 37/32449* (2013.01); *H01J 37/3405* (2013.01); *H01J 37/347* (2013.01); *H01J 37/3417* (2013.01); *H01J 37/3438* (2013.01); *H01J 37/3464* (2013.01); *H01J 2237/006* (2013.01); *H01J 2237/327* (2013.01); *H01J 2237/332* (2013.01)

(58) Field of Classification Search
CPC ............... H01J 37/3417; H01J 37/3438; H01J 2237/006; H01J 2237/327; H01J 2237/332; C23C 14/0063; C23C 14/35
See application file for complete search history.

(56) References Cited

U.S. PATENT DOCUMENTS

| | | | |
|---|---|---|---|
| 4,849,087 A | 7/1989 | Meyer | |
| 4,946,576 A | 8/1990 | Dietrich et al. | |
| 5,616,225 A | 4/1997 | Sieck et al. | |
| 5,873,989 A | 2/1999 | Hughes et al. | |
| 5,897,753 A | 4/1999 | Schatz et al. | |
| 6,375,860 B1 | 4/2002 | Ohkawa et al. | |
| 6,660,365 B1 | 12/2003 | Krisko et al. | |
| 6,716,369 B1 | 4/2004 | Jung et al. | |
| 6,806,651 B1 | 10/2004 | Chistyakov | |
| 6,818,103 B1 | 11/2004 | Scholl et al. | |
| 6,964,731 B1 | 11/2005 | Krisko et al. | |
| 6,974,629 B1 | 12/2005 | Krisko et al. | |
| 7,166,199 B2 | 1/2007 | Hartig | |
| 7,603,763 B2 | 10/2009 | Djayaprawira et al. | |
| 7,914,654 B2 | 3/2011 | Djayaprawira et al. | |
| 9,028,660 B2 | 5/2015 | Bellido-Gonzalez | |
| 2003/0159925 A1* | 8/2003 | Sako | C23C 14/086 204/298.07 |
| 2004/0140196 A1* | 7/2004 | Gopalraja | C23C 14/046 204/192.12 |
| 2005/0106397 A1 | 5/2005 | Krisko et al. | |
| 2007/0074969 A1* | 4/2007 | Simpson | C23C 14/3407 204/192.1 |
| 2007/0080056 A1 | 4/2007 | German et al. | |
| 2009/0032191 A1 | 2/2009 | Chistyakov | |
| 2010/0215903 A1* | 8/2010 | Tonar | B60R 1/084 428/141 |
| 2013/0015054 A1 | 1/2013 | Bjornard | |

FOREIGN PATENT DOCUMENTS

| | | | | |
|---|---|---|---|---|
| JP | 05117847 A | * | 5/1993 | |
| JP | H05-117847 A | | 5/1993 | |
| JP | 2006097036 A | * | 4/2006 | |
| WO | 2008033724 A2 | | 3/2008 | |
| WO | 2013019285 A2 | | 2/2013 | |
| WO | WO 2015139739 A1 | * | 9/2015 | ......... C23C 14/0063 |

OTHER PUBLICATIONS

International Patent Application No. PCT/US2016/016081, International Search Report and Written Opinion dated May 13, 2016, 17 pages.

* cited by examiner

SPUTTERING APPARATUS INCLUDING GAS DISTRIBUTION SYSTEM

FIELD OF THE INVENTION

The invention relates to apparatuses, systems and methods for sputtering thin films onto surfaces. More particularly, the invention relates to sputtering apparatuses, systems and methods that use a gas distribution system that improves uniformity in sputtered thin film thicknesses.

BACKGROUND OF THE INVENTION

In many industries, it is desirable to deposit films onto surfaces of a substrate to provide desired characteristics to the finished coated product. For example, in the glass industry, it is often desirable to deposit films to provide characteristics to the glass related to transmittance, emissivity, reflectivity, durability, color, photocatalysis and chemical resistance.

One deposition method used to deposit films onto substrates is a sputtering method. During sputtering, a substrate is positioned within a vacuum chamber containing a rotating cylindrical target or planar target that has sputterable target material on its outer surface. An electrical field is created between the target (which acts as a cathode) and an anode in the vacuum chamber. Next, an argon gas is introduced to the vacuum chamber. Electrons in the electrical field ionize the gas atoms and create charged plasma. Sputtering occurs when plasma particles impinge on the surface of the target causing emission of sputterable target material onto a substrate.

Certain sputtering systems include magnets that create a magnetic field. Sputtering systems including magnets are often referred to as magnetron sputtering systems. The magnetic field confines the plasma within a relatively narrowly defined area along a target surface. Typically, magnets are placed behind or within the target and are arranged so that the plasma is confined at the bottom surface of the planar or cylindrical target, facing a substrate being coated directly beneath. The plasma sputters target material from this bottom surface, thereby forming a sputtering zone on the target.

In many cases, the magnets are arranged such that a sputtering zone is formed on the target surface. A problem with many previous sputtering systems is that plasma confined at certain areas tends to be denser than plasma confined at other areas. The denser the plasma, the higher the sputtering rate is of target material confined by the plasma. Thus, certain areas have denser plasma than other areas, the target material is sputtered at different rates. As a result, the target is sputtered in an uneven fashion such that the deposited film is non-uniform.

It would be desirable to provide sputtering apparatuses, systems and methods that sputter target material to deposit films having a more uniform thickness. It would also be desirable to provide sputtering apparatuses, systems and methods that provide a more uniform sputtering rate along the entire sputtering zone.

SUMMARY

Figure 1:
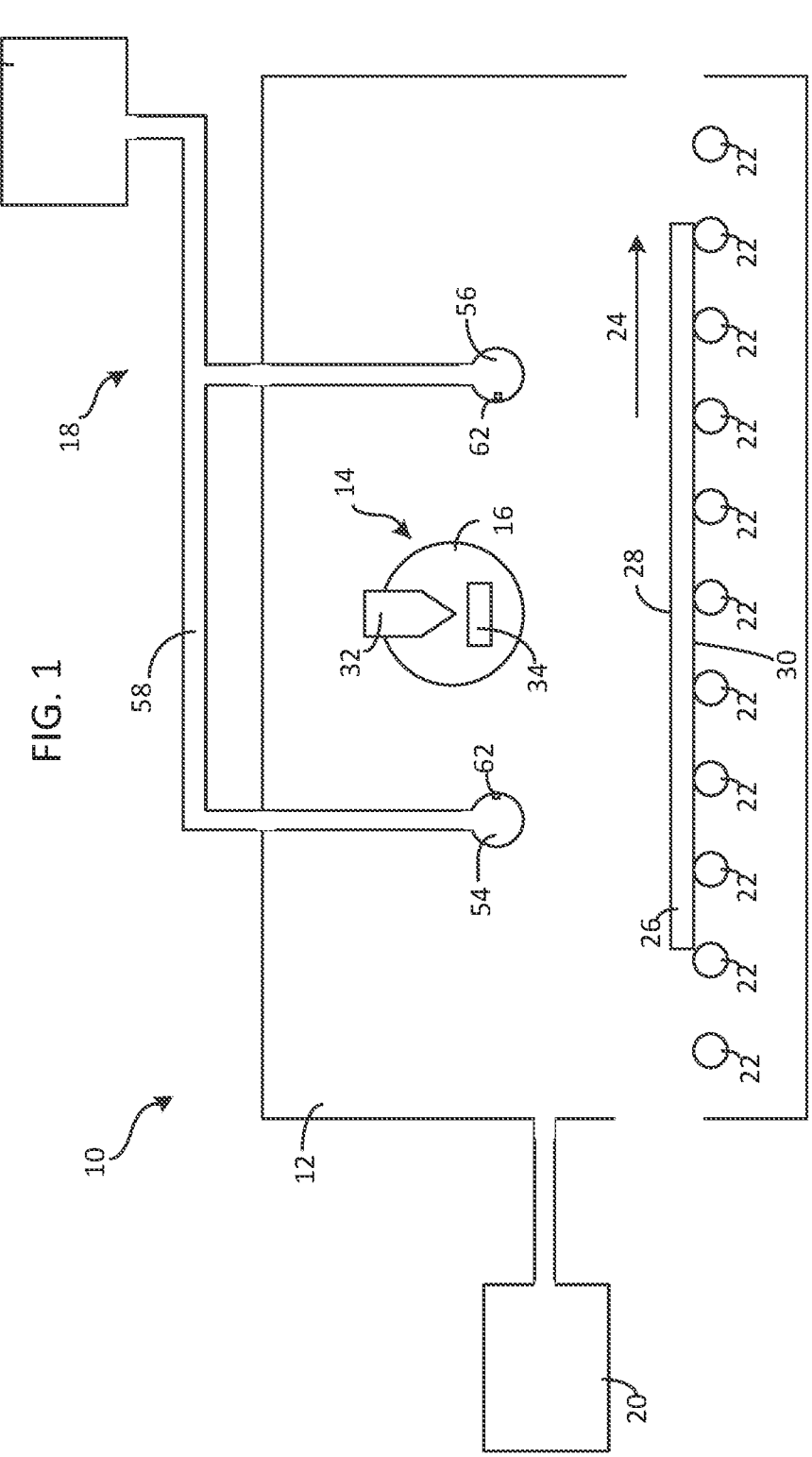
FIG. 1 is a schematic drawing depicting a magnetron sputtering system including a gas distribution system in accordance with an embodiment, wherein the gas distribution system includes two gas delivery members positioned on each side of a sputtering target and connected to a single gas source.
Figure 2:
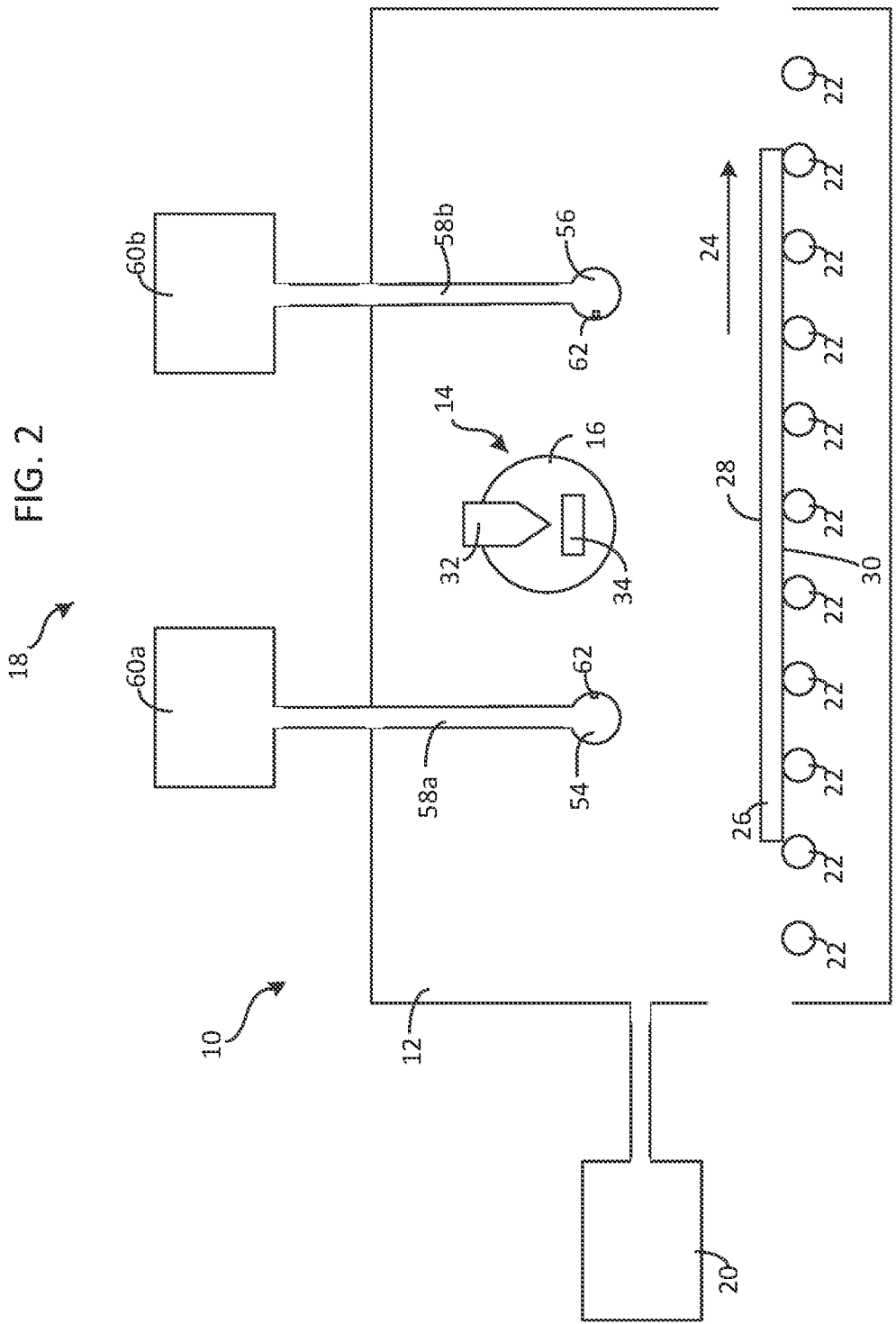
FIG. 2 is a schematic drawing depicting a magnetron sputtering system including a gas distribution system in accordance with another embodiment, wherein the gas distribution system includes two gas delivery members positioned on each side of a sputtering target and each connected to two separate gas sources.

Certain embodiments provide a magnetron sputtering apparatus that includes a vacuum chamber within which a controlled environment may be established, a target including one or more sputterable materials, wherein the target includes a sputtering zone that extends longitudinally along a longitudinal axis, and a gas distribution system comprising a plurality of interfaces extending along the longitudinal axis, wherein the plurality of interfaces includes a first interface and a second interface. A first gas mixture is supplied to the first interface and a second gas mixture is supplied to the second interface, wherein the first gas supply supplies a first gas mixture and the second gas supply supplies a second gas mixture, wherein the first gas mixture includes inert gas having a first atomic weight and the second gas mixture includes inert gas having a second atomic weight, wherein the first atomic weight is different from the second atomic weight. In some cases, the second atomic weight is heavier than the first atomic weight.

In some cases, the first gas mixture can include a single inert gas selected from the group consisting of argon, helium neon, krypton, xenon and radon and the first atomic weight is an atomic weight of the single inert gas and/or the second gas mixture can include a single inert gas selected from the group consisting of argon, helium neon, krypton, xenon and radon and the second atomic weight is an atomic weight of the single inert gas. In other cases, the first gas mixture can include an inert gas mixture including (or consisting essentially of) two or more inert gases selected from the group consisting of argon, helium neon, krypton, xenon and radon and the first atomic weight is an average atomic weight of the two or more inert gases and/or the second gas mixture can include an inert gas mixture including (or consisting essentially of) two or more inert gases selected from the group consisting of argon, helium neon, krypton, xenon and radon and the second atomic weight is an average atomic weight of the two or more inert gases.

Also, in some cases, at least one interface in the plurality of interfaces supplies gas at a continuous flow rate and/or at a continuous pressure. In other cases, at least one interface in the plurality of interfaces supplies gas at a non-continuous flow rate and/or at a non-continuous pressure. Also, the first gas mixture and the second gas mixture can be substantially free of reactive gas. Further, in some cases, the first gas mixture is supplied to the first interface at a first gas pressure and the second gas mixture is supplied to the second interface at a second gas pressure, wherein the first gas pressure is substantially the same as the second gas pressure.

In some embodiments, the gas distribution system includes a first gas distribution member that houses the first interface and a second gas distribution member that houses the second interface. In some cases, the first gas distribution system is an anodic gas distribution member and the second gas distribution system is a non-anodic gas distribution member, wherein the anodic gas distribution member receives a voltage. In other cases, the first gas distribution member is a first anodic gas distribution member and the second gas distribution member is a second anodic gas distribution member, wherein the first anodic gas distribution member is insulated from the second anodic gas distribution member, and wherein the first anodic gas distribution member receives a first voltage and the second gas distribution member receives a second voltage, wherein the first voltage and the second voltage are different.

In certain embodiments, the sputtering zone is a racetrack-shaped sputtering zone comprising a straightaway area sandwiched between a first turnaround area and a second turnaround area, wherein the first interface positions along the first turnaround area or the second turnaround area and the second interface positions along the straightaway area. In some cases, the first interface comprises a plurality of first interfaces that substantially surround at least a portion of the first turnaround area or the second turnaround area. In certain cases, the plurality of first interfaces substantially entirely surrounds the first turnaround area or the second turnaround area. In such cases, the gas distribution system can include an anodic gas distribution member that houses the first interface and receives a voltage that reduces a sputtering rate of the first turnaround area or the second turnaround area relative to a sputtering rate of the straightaway area.

In some embodiments, the plurality of interfaces further includes a third interface and a third gas mixture is supplied to the third interface and the third gas mixture includes inert gas having a third atomic weight, wherein the third atomic weight is different from each the first atomic weight and the second atomic weight. In some cases, the second atomic weight is heavier than the first atomic weight and the third atomic weight is heavier than the first atomic weight but lighter than the second atomic weight. Also, in some cases, the third gas interface is sandwiched between the first interface and the second interface. The third gas mixture can also include a single inert gas selected from the group consisting of argon, helium neon, krypton, xenon and radon and the third atomic weight is an atomic weight of the single inert gas or the third gas mixture includes two or more inert gases selected from the group consisting of argon, helium neon, krypton, xenon and radon and the third atomic weight is an average atomic weight of the two or more inert gases. Further, in some cases, the first gas mixture is supplied to the first interface at a first gas pressure, the second gas mixture is supplied to the second interface at a second gas pressure and the third gas mixture is supplied to the third interface at a third gas pressure, wherein the first gas pressure, the second gas pressure and the third gas pressure are substantially the same.

In other embodiments, a magnetron sputtering apparatus is provided that includes a vacuum chamber within which a controlled environment may be established, a target comprising one or more sputterable materials, wherein the target includes a sputtering zone that extends longitudinally along a longitudinal axis, and a gas distribution system comprising a plurality gas distribution members, wherein the plurality of gas distribution members includes a first anodic gas distribution member and a second anodic gas distribution member, wherein the first anodic gas distribution member is insulated from the second anodic gas distribution member, and wherein the first anodic gas distribution remember receives a first voltage and the second anodic gas distribution member receives a second voltage, wherein the first voltage is different than the second voltage. In some cases, the first voltage and/or the second voltage is an adjustable voltage. Also, in some cases, the first voltage and/or the second voltage is a pulsed voltage.

In some embodiments, the sputtering zone is a racetrack-shaped sputtering zone comprising a straightaway area sandwiched between a first turnaround area and a second turnaround area, wherein the first anodic gas distribution member supplies gas to either the first turnaround area or the second turnaround area and the second anodic gas distribution member supplies gas to the straightaway area, wherein the first voltage is lower than the second voltage. In some cases, the first anodic gas distribution member includes a plurality of interfaces that substantially surround at least a portion of the first turnaround area or the second turnaround area. In other cases, the first anodic gas distribution member includes a plurality of interfaces that substantially surround an entire first turnaround area or the second turnaround area.

Also, in some embodiments, the first anodic gas distribution member supplies a first gas mixture and the second anodic gas distribution member supplies a second gas mixture, wherein the first gas mixture includes an inert gas having a first atomic weight and a second gas mixture including inert gas having a second atomic weight, wherein the first atomic weight is different from the second atomic weight. In some cases, the second atomic weight is heavier than the first atomic weight.

Other embodiments provide a magnetron sputtering apparatus including a vacuum chamber within which a controlled environment may be established, a target comprising one or more sputterable materials, wherein the target includes a racetrack-shaped sputtering zone that extends longitudinally along a longitudinal axis and comprises a straightaway area sandwiched between a first turnaround area and a second turnaround area, and a gas distribution system comprising a plurality gas distribution members, wherein the plurality of gas distribution members includes an anodic gas distribution member and a non-anodic gas distribution member, wherein the anodic gas distribution member is insulated from the non-anodic gas distribution member, and wherein the anodic gas distribution member supplies gas to either the first turnaround area or the second turnaround area and receives a voltage that reduces a sputtering rate of the first turnaround area or the second turnaround area relative to the straightaway area. In some cases, the first voltage and/or the second voltage is an adjustable voltage. Also, in some cases, the first voltage and/or the second voltage is a pulsed voltage.

In some embodiments, the anodic gas distribution member includes a plurality of interfaces that substantially surround at least a portion of the first turnaround area or the second turnaround area. In some cases, the anodic gas distribution member includes a plurality of interfaces that substantially surround an entire first turnaround area or the second turnaround area. In some cases, the anodic gas distribution member supplies a first gas mixture and the non-anodic gas distribution member supplies a second gas mixture, wherein the first gas mixture includes an inert gas having a first atomic weight and a second gas mixture including inert gas having a second atomic weight, wherein the first atomic weight is different from the second atomic weight. In some cases, the second atomic weight is heavier than the first atomic weight.

Other embodiments provide a magnetron sputtering apparatus including a vacuum chamber within which a controlled environment may be established, a target comprising one or more sputterable materials, wherein the target includes a racetrack-shaped sputtering zone that extends longitudinally along a longitudinal axis and comprises a straightaway area sandwiched between a first turnaround area and a second turnaround area, a gas distribution system that supplies a first gas mixture to the first turnaround area and/or the second turnaround area and supplies a second gas mixture to the straightaway area, wherein the first gas mixture reduces a sputtering rate relative to the second gas mixture. In some cases, the first gas mixture includes inert gas having a first atomic weight and the second gas mixture includes inert gas having a second atomic weight, wherein the second atomic weight is heavier than the first atomic weight.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention relates to a new gas distribution system that helps provide a more uniform sputtering rate along a sputtering zone on a target. The gas distribution system is part of a magnetron sputtering system. FIGS. 1-7 each depict a standard magnetron sputtering system 10 having different embodiments of the new gas distribution system. Generally, the sputtering system 10 includes a vacuum chamber 12 defining a controlled environment, a cathode assembly 14 including a target 16 having one or more sputterable target materials, and the gas distribution system 18.

Sputtering techniques and equipment utilized in magnetron sputtering systems are quite well known in the present art. For example, magnetron sputtering chambers and related equipment are available commercially from a variety of sources (e.g., Grenzebach or Soleras). Examples of useful magnetron sputtering techniques and equipment are also disclosed in U.S. Pat. No. 4,166,018, issued to Chapin, the entire teachings of which are incorporated herein by reference.

The vacuum chamber 12 generally includes metallic walls, typically made of steel or stainless steel, operably assembled to form a chamber that can accommodate a vacuum in which the sputtering process may occur. A vacuum source 20 is operably connected to the vacuum chamber 12 to provide a controlled vacuum environment within the chamber 12.

The vacuum chamber 12 comprises a substrate support 22 defining a path of substrate travel 24 extending substantially horizontally through the chamber 12. Preferably, the substrate support 22 is configured for supporting a substrate 26 in a horizontal configuration (e.g., wherein a top major surface 28 of the substrate 26 is upwardly oriented while a bottom major surface 30 of the substrate 26 is downwardly oriented) while the substrate 26 is being coated. In the embodiments shown in FIGS. 1-7, the substrate support 22 comprises a plurality of spaced-apart transport rollers that rotate to convey the substrate 26 along the path of substrate travel 24. While the illustrated substrate support 22 comprises a plurality of spaced-apart rollers, it is to be appreciated that other types of substrate supports can be used.

Substrates of various sizes can be used in the present invention. Commonly, large-area substrates are used. Certain embodiments involve a substrate having a length and/or width of at least 0.5 meter, preferably at least 1 meter, perhaps more preferably at least 1.5 meters (e.g., between 2 meters and 4 meters), and in some cases at least 3 meters. In some embodiments, the substrate is a jumbo glass sheet having a length and/or width that is between 3 meters and 10 meters, e.g., a glass sheet having a width of 3.5 meters and a length of 6.5 meters. Substrates having a length and/or width of greater than 10 meters are also anticipated.

In some embodiments, the substrate is a square or rectangular glass sheet. The substrate in these embodiments can have any of the dimensions described in the preceding paragraph and/or the following paragraph. In one embodiment, the substrate is a rectangular glass sheet having a width of between 3 meters and 5 meters, such as about 3.5 meters, and a length of between 6 meters and 10 meters, such as about 6.5 meters.

Substrates of various thicknesses can be used in the present invention. In some embodiments, the substrate (which can optionally be a glass sheet) has a thickness of 1-8 mm. Certain embodiments involve a substrate with a thickness of between 2.3 mm and 4.8 mm, and perhaps more preferably between 2.5 mm and 4.8 mm. In one particular embodiment, a sheet of glass (e.g., soda-lime glass) with a thickness of 3 mm is used.

In certain embodiments, such as those illustrated in FIGS. 1-7, the vacuum chamber 12 comprises a downward coating configuration adapted for coating a top major surface 28 of the substrate 26. In such embodiments, the downward sputtering configuration comprises at least one cathode assembly 14 positioned above the path of substrate travel 24. Additionally, the vacuum chamber 12 includes a gas distribution system 18 positioned above the path of substrate travel 24.

In other embodiments (not shown), the vacuum chamber 12 can include an upward coating configuration adapted for coating a bottom major surface 30 of the substrate 26. In such embodiments, the upward sputtering configuration comprises at least one lower cathode assembly 14 positioned beneath the path of substrate travel 24. Here, the vacuum chamber 12 includes a lower gas distribution system 18 positioned beneath the path of substrate travel 24. Upward sputtering systems are described in U.S. patent application Ser. Nos. 09/868,542, 09/868,543, 09/979,314, 09/572,766, and 09/599,301.

The cathode assembly 14 generally comprises a cylindrical target 16, a motor 32 and a magnet assembly 34. Generally, the cylindrical target 16 includes a tubular backing formed of electrically conductive material, such as stainless steel, aluminum or any other suitably conductive material. The outer surface of the cylindrical target 16 is normally coated with a sputterable target material, which is intended to be sputtered onto the substrate surface 28.

Sputterable target material includes, but is not limited to, material such as silicon, zinc, tin, silver, gold, chromium, aluminum, copper, nickel, titanium, niobium or combinations thereof. Compounds of various metals, such as nickel-chromium, can be sputtered using targets made of the desired compound. Silicon can also be used as cylindrical target material, for example, by plasma spraying silicon onto a support tube. In some embodiments, the sputterable target material comprises, consists essentially of, or consists of a metallic material. In certain embodiments, the sputterable target material comprises, consists essentially of, or consists of silver.

The cathode assembly 14 also includes a motor 32 operably connected to the cylindrical target 16 by any clamping or bracketing means (not shown) known in the art. The clamping or bracketing device may be any type of clamp, bracket, frame, fastener or support that keeps the cylindrical target 16 in a stationary position and does not affect the rotation of the cylindrical target 16. The motor 32 can be any motor known in the art (e.g., stepper motor, electric motor, hydraulic motor and/or pneumatic motor) that causes the cylindrical target 16 to rotate about its longitudinal axis. Although a cylindrical target 16 is illustrated in the figures, skilled artisans would understand that a planar target can instead be used.

The cathode assembly 14 further includes a magnet assembly 34. The magnet assembly 34 includes any magnet assembly known in the art that generates a plasma confinement field adjacent a surface of the target so that a sputtering zone forms on a target surface. In some cases, the magnet assembly 34 is positioned within the target 16. In other cases, the magnet assembly 34 is positioned outside the target 16. The sputtering zone can have any desired shape and in many embodiments is a racetrack-shaped sputtering zone.

Figure 7:
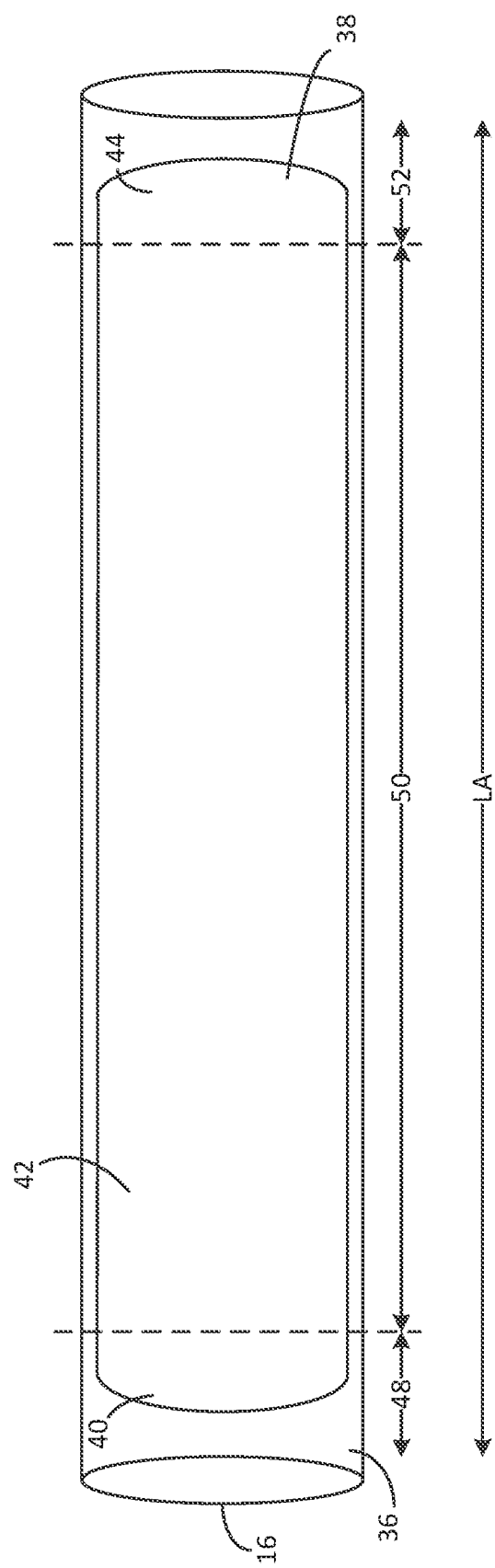
FIG. 7 is a bottom view of a sputtering target having a general sputtering zone in accordance with an embodiment.

The magnetron sputtering system 10 includes a new gas distribution system 18 that helps provide a generally uniform sputtering rate along an entire sputtering zone. FIG. 7 illustrates a cylindrical target 16 having a general sputtering zone 38 on a target surface 36. The sputtering zone 38 generally has a first area 40, a second area 42 and a third area 44. The second area 42 is sandwiched between the first area 40 and the third area 44. The sputtering zone 38 also extends for a longitudinal distance along a longitudinal axis LA of a cylindrical target. The first area 40 extends longitudinally along a longitudinal distance 48, the second area 42 extends longitudinally along a longitudinal distance 50 and the third area 44 extends longitudinally along a longitudinal distance 52. The longitudinal distances 48, 50, 52 do not overlap. Likewise, the areas 40, 42, 44 do not overlap.

The first area 40 has a first sputtering rate, the second area 42 has a second sputtering rate and the third area 44 has a third sputtering rate when sputtered in an argon atmosphere. In some cases, the first sputtering rate is higher than the second sputtering rate. In other cases, each the first and third sputtering rate is higher than the second sputtering rate. The new gas distribution system helps to provide a more uniform sputtering rate along each of the areas 40, 42, 44.

Figure 8:
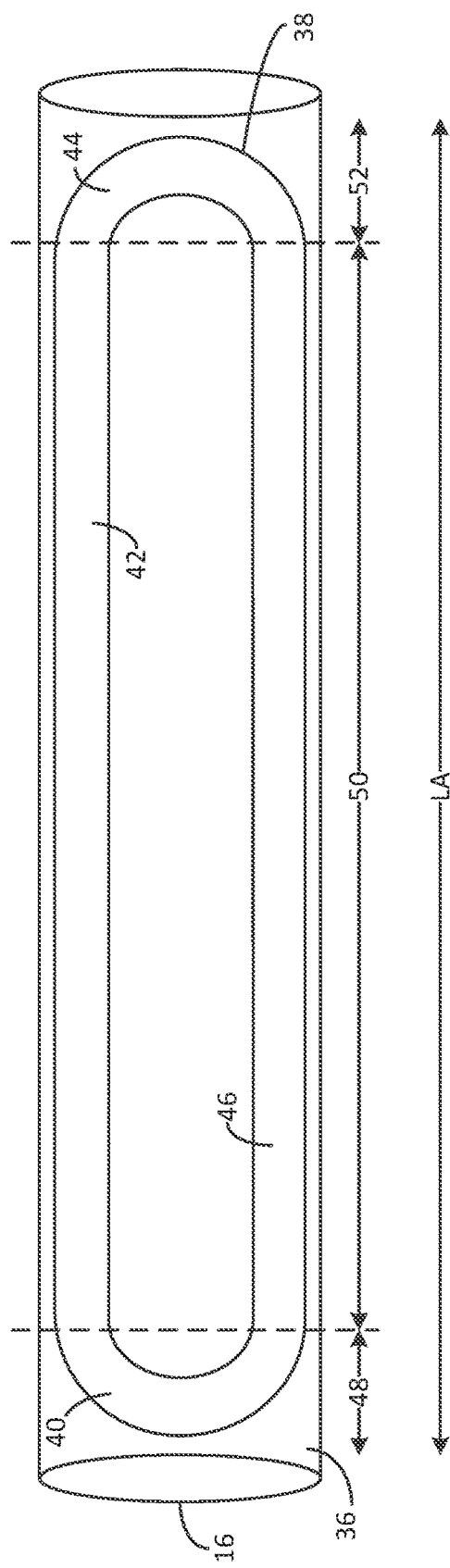
FIG. 8 is a bottom view of a sputtering target having a racetrack-shaped sputtering zone in accordance with an embodiment.

In some embodiments, the gas distribution system 18 helps provide a more uniform sputtering rate along a racetrack-shaped sputtering zone 38. FIG. 8 illustrates a cylindrical target 16 having a racetrack-shaped sputtering zone 38 on a target surface 36. While a racetrack-shaped sputtering zone is illustrated in many embodiments, skilled artisans will understand that the sputtering zone can have any desired shape. The plasma confinement field generally forms a race-track shaped electron drift path on a target surface 36 which in turn forms the racetrack-shaped sputtering zone 38. The target surface 36 is generally the surface that faces the substrate 26. For example, in cases where the target 16 is an upper target, the target surface 36 is a bottom surface that faces a substrate beneath. In cases where the target 16 is a lower target, the target surface 36 is an upper surface that faces a substrate above. The cylindrical target 30 rotates during sputtering so that its outer circumference of sputterable target material rotates through the racetrack-shaped sputtering zone 38.

The racetrack-shaped sputtering zone 38 generally includes two turnaround areas 40, 44 and two straightaway areas 42, 46. In particular, the racetrack-shaped sputtering zone 38 includes a first turnaround area 40, a first straightaway area 42, a second turnaround area 44 and a second straightaway area 46. Also, the first straightaway area 42 (or the second straightaway area 46) is sandwiched between the first turnaround area 40 and the second turnaround area 44. The racetrack-shaped sputtering zone 38 also extends for a longitudinal distance along a longitudinal axis LA of a cylindrical target. The racetrack-shaped sputtering zone 38 includes a first turnaround area 40 that extends longitudinally along a longitudinal distance 48, a first straightaway area 42 that extends longitudinally along a longitudinal distance 50, a second turnaround area 44 that extends longitudinally along a longitudinal distance 52 and a second straightaway area 46 that extends longitudinally along a longitudinal distance 50. In some cases, the two turnaround areas 40, 44 have a first sputtering rate and the two straightaway areas 42, 46 have a second sputtering rate when sputtered in an argon atmosphere wherein the first sputtering rate is higher than the second sputtering rate. The new gas distribution system 18 helps to even out the sputtering rates between the two turnaround areas 40, 44 and the two straightaway areas 42, 26.

In certain embodiments, the gas distribution system 18 provides new arrangements of interfaces that each supply a particular gas mixture to a localized area on the sputtering zone. The gas mixture is selected to control the sputtering rate along that localized area. Generally, the gas distribution system 18 includes at least a first interface and a second interface. The first interface is positioned to supply gas to a first localized area whereas the second interface is positioned to supply gas to a second localized area. A first gas mixture is supplied to the first interface and a second gas mixture is supplied to the second interface. The first gas mixture and the second gas mixture are selected such that the sputtering rate along the two localized areas are more uniform.

In some embodiments, the first gas mixture includes inert gas "y" having a first atomic weight and the second gas mixture includes inert gas "x" having a second atomic weight, wherein the first atomic weight is different from the second atomic weight. In some cases, the second atomic weight is heavier than the first atomic weight. A gas mixture with a heavier atomic weight is supplied to a localized area where it is desired to increase the sputtering rate relative to another localized area. Likewise, a gas mixture with a lighter atomic weight is supplied to a localized area where it is desired to decrease the sputtering rate relative to another localized area. Argon is a standard sputtering gas and has an atomic weight of 39.95. Helium is a lighter gas than argon and has an atomic weight of 4.003. Krypton is a heavier gas than argon and has an atomic weight of 83.80.

In certain embodiments, the plurality of interfaces 62 includes at least a first interface, a second interface and a third interface. In some cases, the third interface is sandwiched between the first interface and the second interface. A first gas mixture is supplied to the first interface, a second gas mixture is supplied to the second interface and a third gas mixture is supplied to the third interface. Again, the three gas mixtures are selected such that the sputtering rates along the three localized areas are more uniform. Some embodiments above describe a first interface and a second interface or a first interface, a second interface and a third interface. Each the first interface, the second interface and the third interface in these embodiments can comprise a single interface or a plurality of interfaces or a set of interfaces.

In some embodiments, the first gas mixture includes inert gas "y" having a first atomic weight, the second gas mixture includes inert gas "x" having a second atomic weight, and the third gas mixture includes inert gas "z" having a third atomic weight. In some cases, each the first atomic weight, the second atomic weight and the third atomic weight are different. In certain cases, the second atomic weight is heavier than the first atomic weight and the third atomic weight is heavier than the first atomic weight but is lighter than the second atomic weight.

In some cases, the plurality of interfaces are arranged to supply gas to a racetrack-shaped sputtering zone on the target. Referring back to the racetrack-shaped sputtering zone 38 of FIG. 8, the racetrack-shaped sputtering zone 38 extends for a longitudinal distance along a longitudinal axis LA of a cylindrical target and includes a first turnaround area 40, a first straightaway area 42, a second turnaround area 44 and a second straightaway area 46.

In some cases, the gas distribution system 18 has a first interface positioned along either the first turnaround area 40 or the second turnaround area 44 and a second interface positioned along either the first straightaway area 42 or the second straightaway area 46. Traditionally, the turnaround areas 40, 44 have a faster sputtering rate in an argon atmosphere than the straightaway areas 42, 46. In order to make the sputtering rate across all these areas more uniform, the first interface can supply a gas mixture including an inert gas "y" having a lighter atomic weight and the second interface can supply a gas mixture including an inert gas "x" with a heavier atomic weight. When the gas mixture supplied to a turnaround area 40, 44 has lighter atomic weight that the gas mixture supplied to the straightaway areas 42, 46, the sputtering rate becomes more uniform across each of these areas.

In other cases, the gas distribution system 18 has a first interface positioned along either the first turnaround area 40 or the second turnaround area 44, a second interface positioned along either the first straightaway area 42 or the second straightaway area 46 and a third interface that is sandwiched between the first interface and the second interface. In this embodiment, the third interface can serve as an intermediate or transitional interface that supplies a gas mixture including an inert gas "z" having a third atomic weight that is heavier than the first atomic weight but lighter than the second atomic weight.

In some embodiments, the first gas mixture includes a single inert gas selected from the group consisting of argon, helium neon, krypton, xenon and radon and the first atomic weight is an atomic weight of the single inert gas and/or the second gas mixture includes a single inert gas selected from the group consisting of argon, helium neon, krypton, xenon and radon and the second atomic weight is an atomic weight of the single inert gas and/or the third gas mixture includes a single inert gas selected from the group consisting of argon, helium neon, krypton, xenon and radon and the third atomic weight is an atomic weight of the single inert gas In other embodiments, the first gas mixture includes an inert gas mixture including two or more inert gases selected from the group consisting of argon, helium neon, krypton, xenon and radon and the first atomic weight is an average atomic weight of the two or more inert gases and/or the second gas mixture includes an inert gas mixture including two or more inert gases selected from the group consisting of argon, helium neon, krypton, xenon and radon and the second atomic weight is an average atomic weight of the two or more inert gases and/or the third gas mixture includes an inert gas mixture including two or more inert gases selected from the group consisting of argon, helium neon, krypton, xenon and radon and the third atomic weight is an average atomic weight of the two or more inert gases. In some cases, the first gas mixture includes a reactive gas in addition to the inert gas and/or the second gas mixture includes a reactive gas in addition to the inert gas and/or the third gas mixture includes a reactive gas in addition to the inert gas.

FIGS. 9-20 illustrate schematics of exemplary gas distribution systems 18 having a plurality of interfaces 62 with different arrangements. These schematics are not to scale and are intended to illustrate general concepts. The embodiments of FIGS. 9-11 and 15-17 contemplate the use of a single gas source 60. The single gas source 60 houses separate gas sources that supply different gas mixtures. The embodiments of FIGS. 12-14 and 18-20 contemplate the use of a first gas source 60a and a second gas source 60b. Here, each of the gas sources 60a, 60b houses separate gas sources that supply different gas mixtures. These different embodiments are intended to show that any number of gas sources or arrangement of gas sources can be used to supply the gas mixtures "y," "x," and optically "z" to the interfaces 62 using any desired pipe system known in the art.

The embodiments of FIGS. 9-14 include gas distribution systems 18 that have at least a first interface and at least a second interface, wherein the first interface is supplied with first gas mixture including an inert gas "y" and the second interface is supplied with a second gas mixture including an inert gas "x." In some cases, both the first gas mixture and the second gas mixture are supplied at the same or substantially the same pressure. Likewise, in some embodiments, both the first gas mixture and the second gas mixture are free of or substantially free of a reactive gas.

The embodiments of FIGS. 15-20 include gas distribution systems 18 that have at least a first interface, at least a second interface and at least a third interface, wherein the first interface is supplied with first gas mixture including an inert gas "y," the second interface is supplied with a second gas mixture including an inert gas "x" and the third interface is supplied with a third gas mixture including an inert gas "z." In some cases, the first gas mixture, the second gas mixture and the third gas mixture are supplied at the same or substantially the same pressure. Likewise, in some embodiments, the first gas mixture, the second gas mixture and the third gas mixture are free of or substantially free of a reactive gas.

Figure 9:
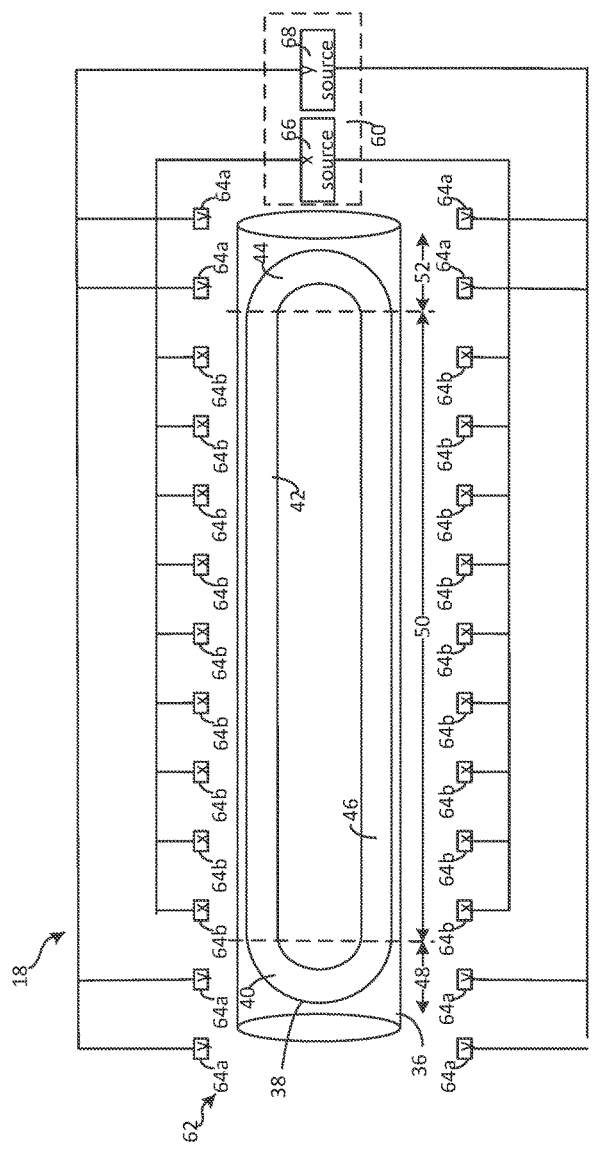
FIG. 9 is a schematic drawing depicting an arrangement of interfaces of a gas distribution system in accordance with another embodiment, wherein the interfaces supply two gas mixtures from a single gas source and are arranged along each side of a sputtering target.

Each of the interface arrangements shown in FIGS. 9-20 will now be described in more detail. FIGS. 9 and 12 illustrates a gas distribution system 18 that includes a plurality of interfaces 62 that extend along a longitudinal axis LA of a target having a racetrack-shaped sputtering zone. The plurality of interfaces 62 are arranged along each side of the sputtering target. Each side includes first interfaces 62a and second interfaces 62b. In particular, on each side, the first interfaces 62a are provided as outermost interfaces that sandwich a plurality of second interfaces 62b. The interfaces first 62a are positioned to supply a first gas mixture including an inert gas "y" to the turnaround areas 40, 44 of the racetrack-shaped sputtering zone. The second interfaces 62b are positioned supply a second gas mixture including an inert gas "x" to the straightaway areas 42, 46 of the racetrack-shaped sputtering zone. For example, the first interfaces 62a can be positioned adjacent the first turnaround area 40 along a longitudinal distance 48 and/or adjacent the second turnaround area 44 along a longitudinal distance 52. Also, the second interfaces 62a can be positioned adjacent the first straightaway area 42 and/or the second straightaway area 46 along a longitudinal distance 50.

Figure 10:
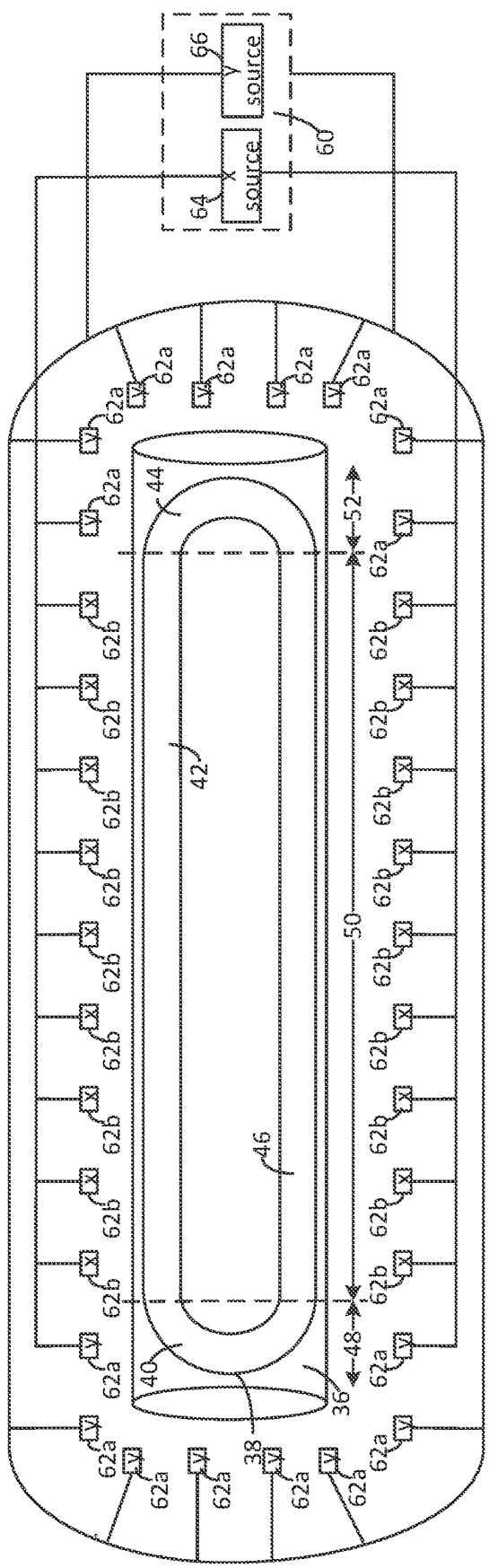
FIG. 10 is a schematic drawing depicting an arrangement of interfaces of a gas distribution system in accordance with another embodiment, wherein the interfaces supply two gas mixtures from a single gas source and are arranged to substantially entirely surround a sputtering target.
Figure 13:
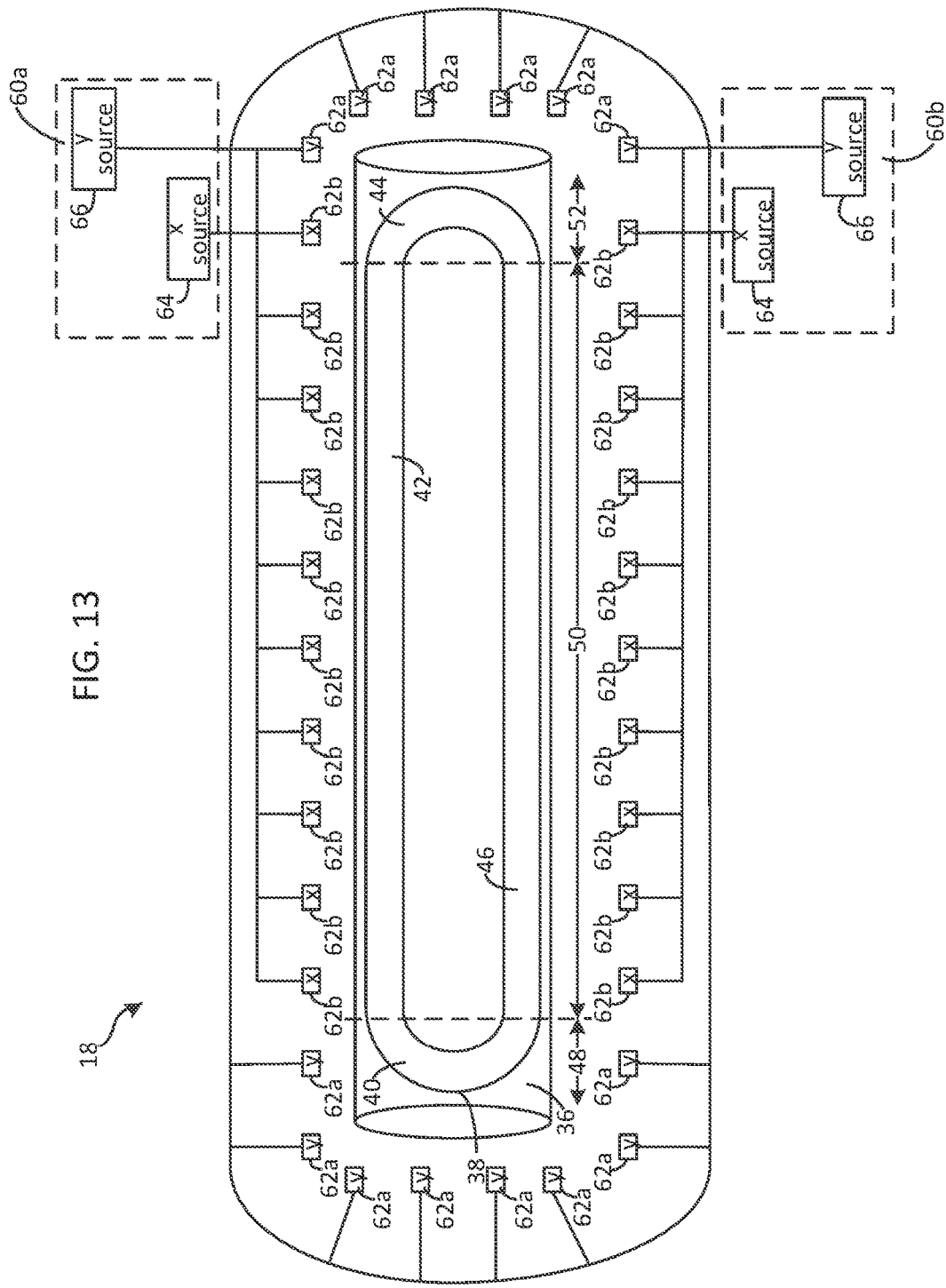
FIG. 13 is a schematic drawing depicting an arrangement of interfaces of a gas distribution system in accordance with another embodiment, wherein the interfaces supply two gas mixtures from two gas sources and are arranged to substantially entirely surround a sputtering target.

FIGS. 10 and 13 illustrates a gas distribution system 18 that includes a plurality of interfaces 62 that extend along a longitudinal axis LA of a target having a racetrack-shaped sputtering zone. The plurality of interfaces 62 are arranged to substantially entirely surround the target. In fact, in some cases, the plurality of interfaces 62 are also arranged as a racetrack shape that substantially entirely surrounds the racetrack-shaped sputtering zone 38. Again, the first interfaces 62a are positioned to supply a first gas mixture including an inert gas "y" to the turnaround areas 40, 44 of the racetrack-shaped sputtering zone and the second interfaces 62b are positioned supply a second gas mixture including an inert gas "x" to the straightaway areas 42, 46 of the racetrack-shaped sputtering zone. Here too, the first interfaces 62a can be positioned adjacent to (e.g., by substantially surrounding) the first turnaround area 40 along a longitudinal distance 48 and/or adjacent to (e.g., by substantially surrounding) the second turnaround area 44 along a longitudinal distance 52. Also, the second interfaces 62b can be positioned adjacent the first straightaway area 42 and/or the second straightaway area 46 along a longitudinal distance 50.

Figure 11:
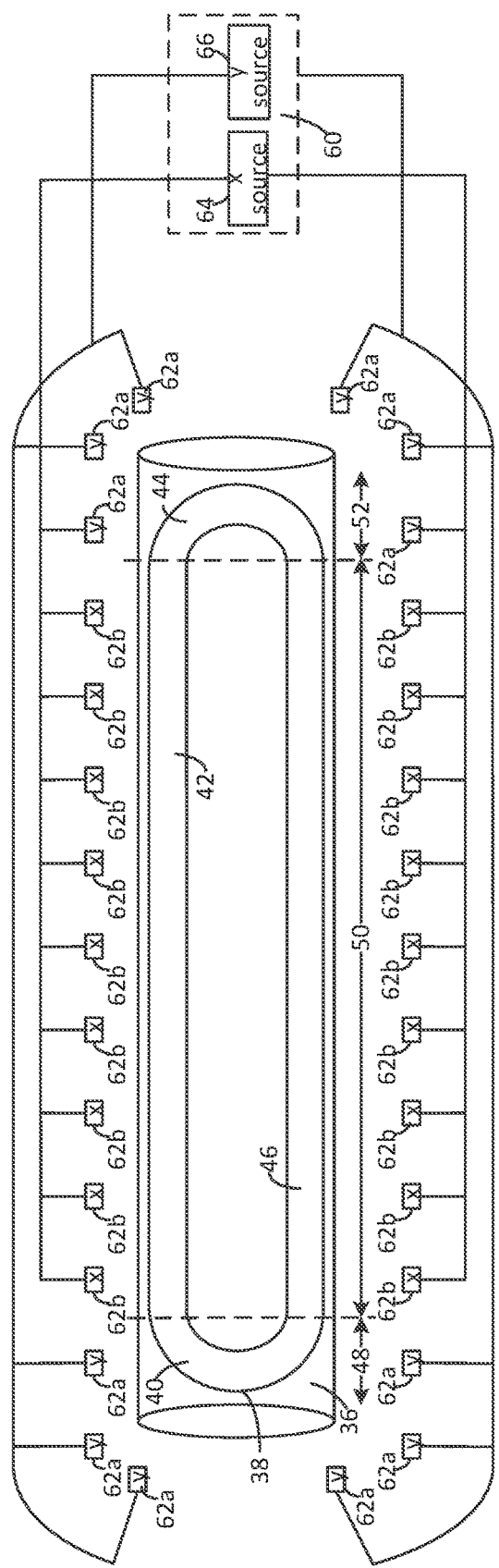
FIG. 11 is a schematic drawing depicting an arrangement of interfaces of a gas distribution system in accordance with another embodiment, wherein the interfaces supply two gas mixtures from a single gas source and are arranged along each side of a sputtering target and to partially surround ends of the sputtering target.
Figure 12:
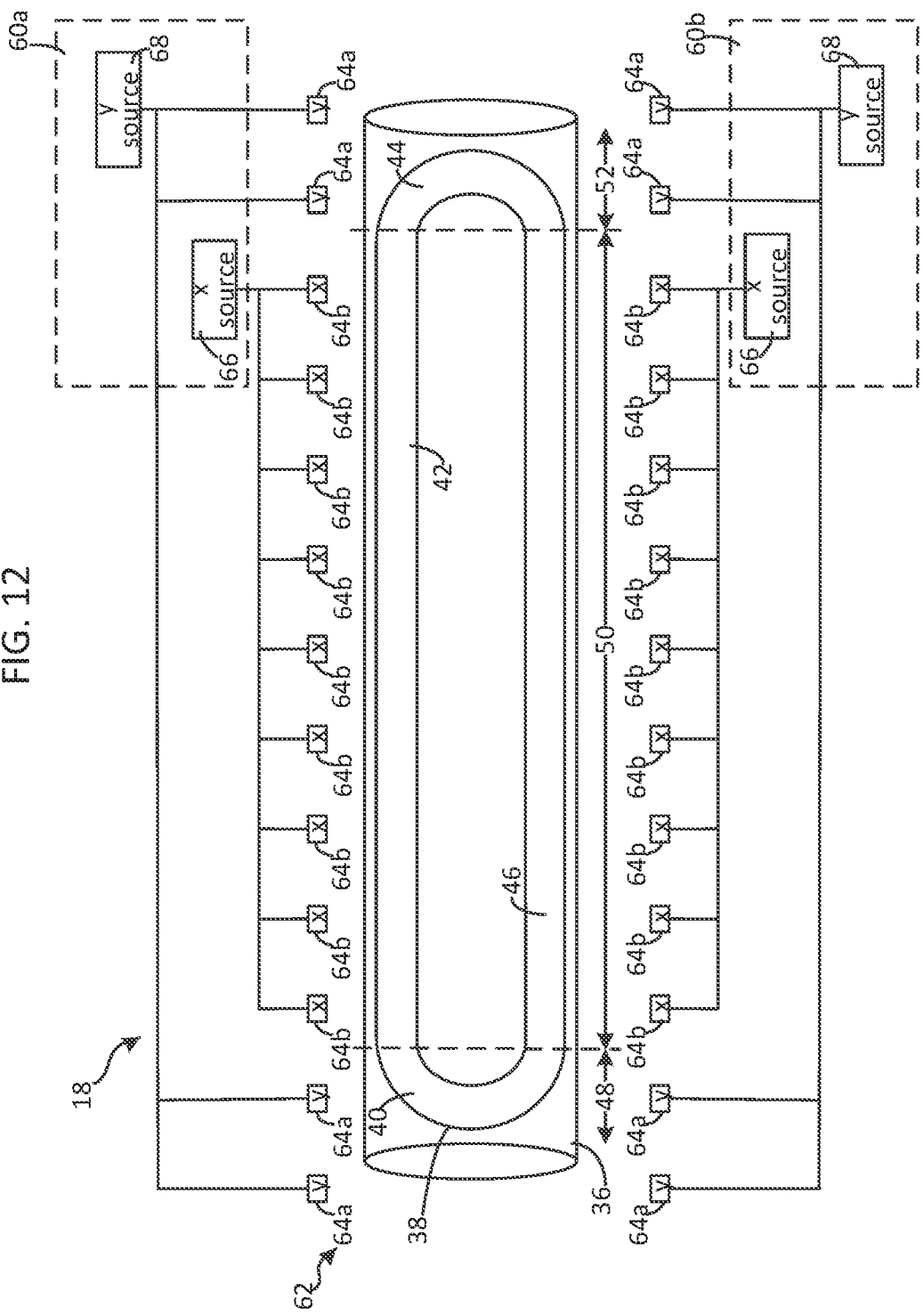
FIG. 12 is a schematic drawing depicting an arrangement of interfaces of a gas distribution system in accordance with another embodiment, wherein the interfaces supply two gas mixtures from two gas sources and are arranged along each side of a sputtering target.
Figure 14:
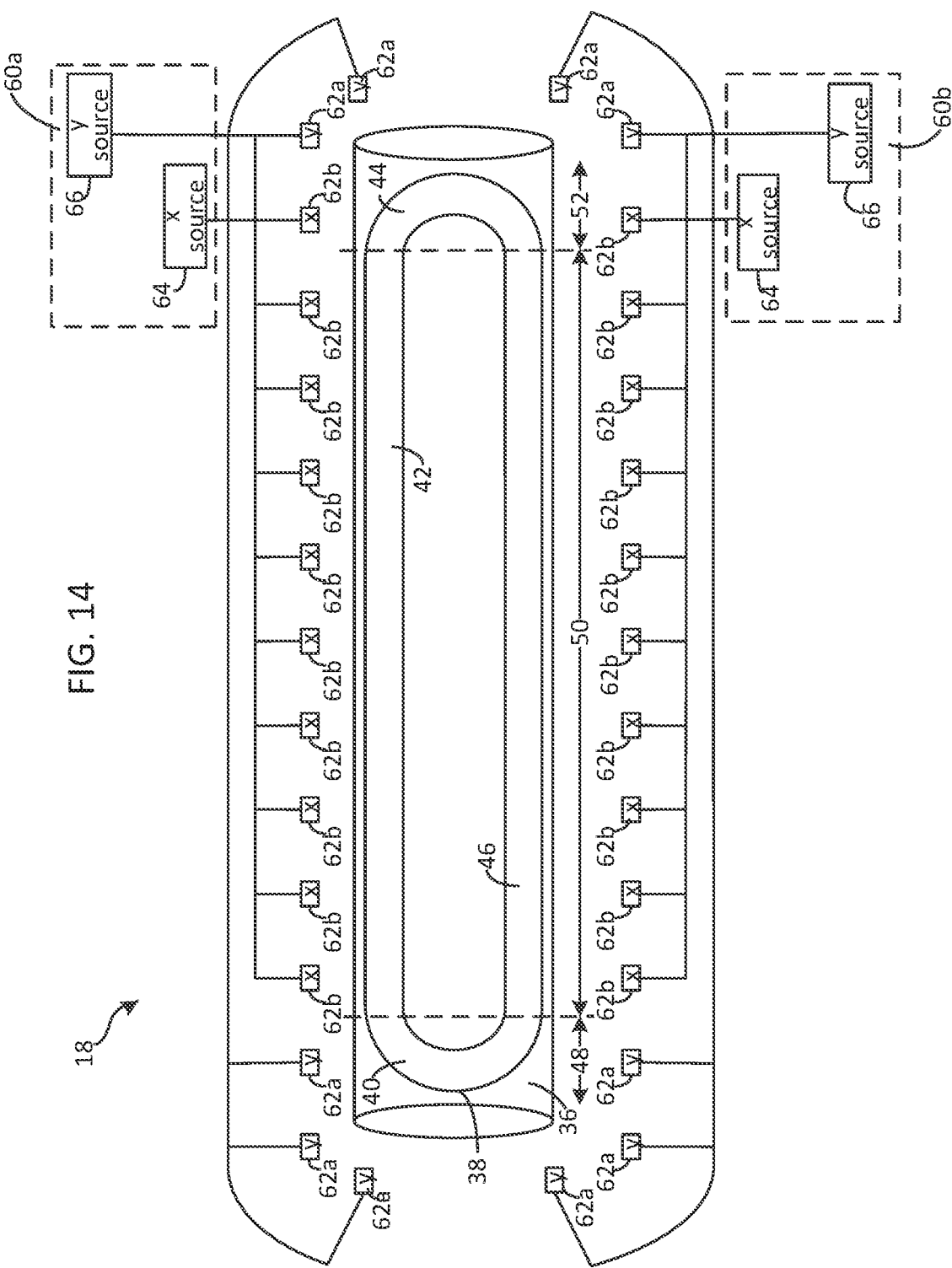
FIG. 14 is a schematic drawing depicting an arrangement of interfaces of a gas distribution system in accordance with another embodiment, wherein the interfaces supply two gas mixtures from two gas sources and are arranged along each side of a sputtering target and to partially surround ends of the sputtering target.

FIGS. 11 and 14 illustrates a gas distribution system 18 that includes a plurality of interfaces 62 that extend along a longitudinal axis LA of a target having a racetrack-shaped sputtering zone. The plurality of interfaces 62 are arranged along each side of the sputtering target. Each side of interfaces 62 also partially surrounds ends of the target. Again, the first interfaces 62a are positioned to supply a first gas mixture including an inert gas "y" to the turnaround areas 40, 44 of the racetrack-shaped sputtering zone and the second interfaces 62b are positioned supply a second gas mixture including an inert gas "x" to the straightaway areas 42, 46 of the racetrack-shaped sputtering zone. Also, the first interfaces 62a can be positioned adjacent to (e.g., by partially surrounding) the first turnaround area 40 along a longitudinal distance 68 and/or adjacent to (e.g., by partially surrounding) the second turnaround area 44 along a longitudinal distance 52. Also, the second interfaces 62b can be positioned adjacent the first straightaway area 42 and/or the second straightaway area 46 along a longitudinal distance 50.

Figure 15:
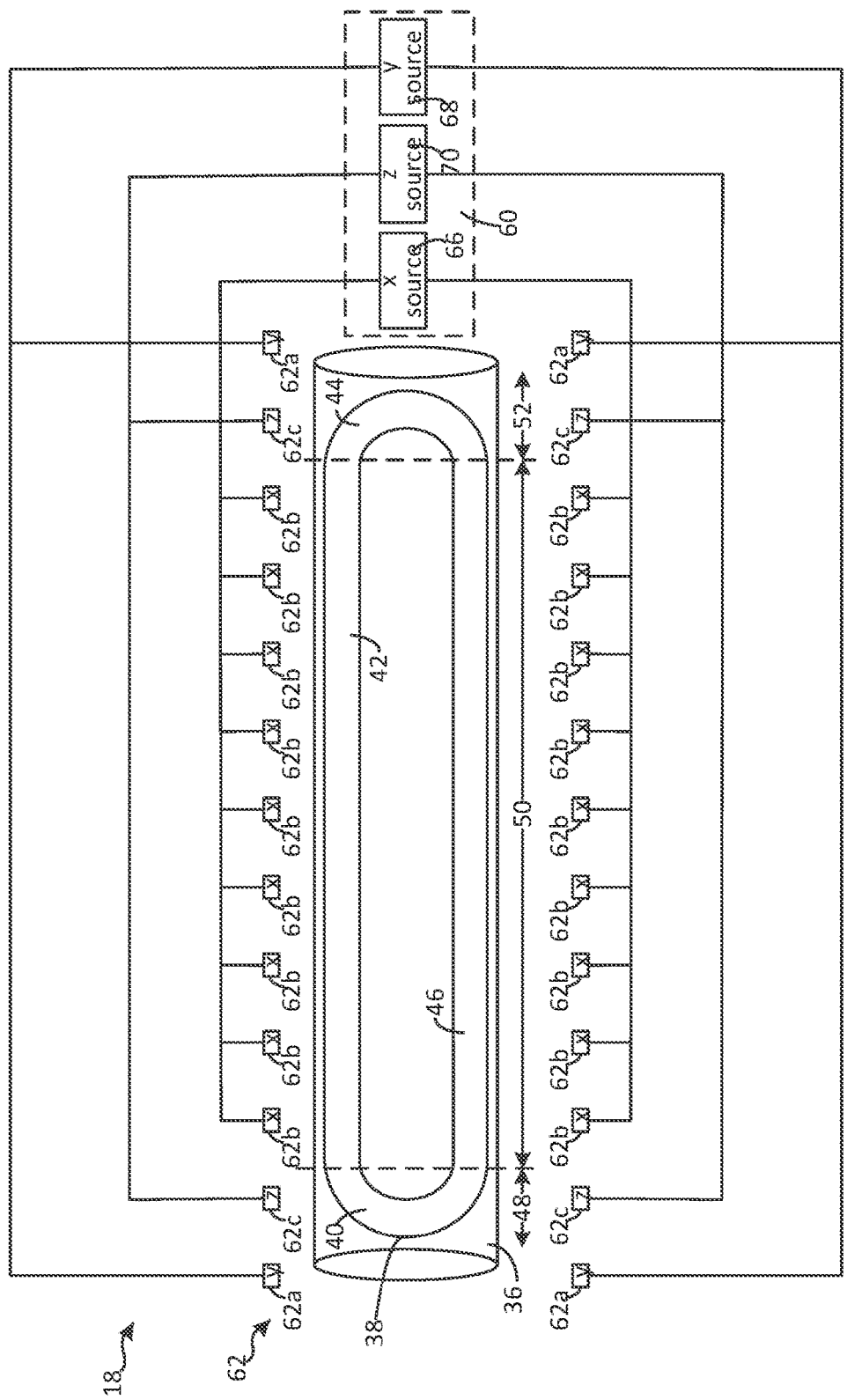
FIG. 15 is a schematic drawing depicting an arrangement of interfaces of a gas distribution system in accordance with another embodiment, wherein the interfaces supply three gas mixtures from a single gas source and are arranged along each side of a sputtering target.
Figure 18:
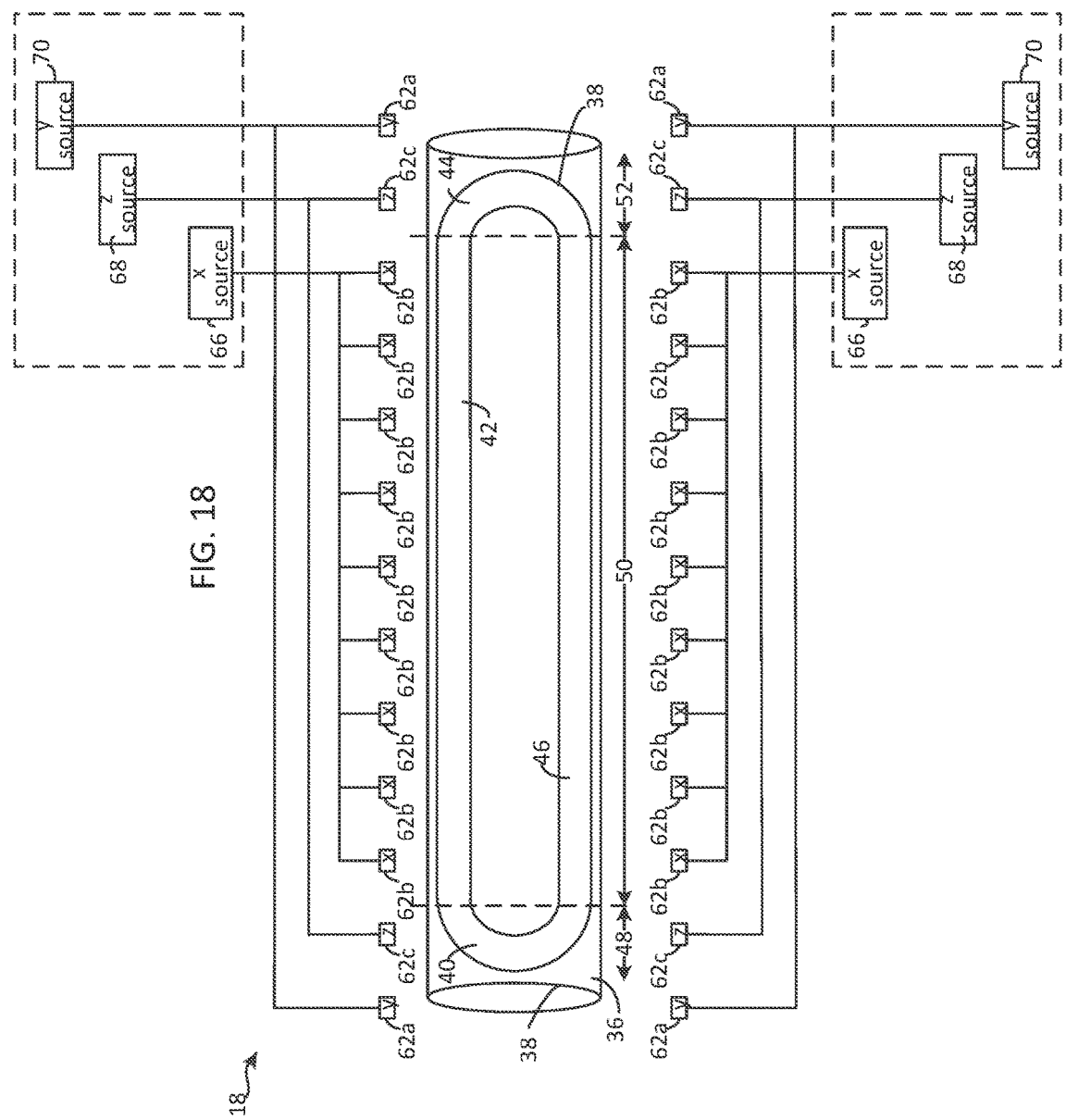
FIG. 18 is a schematic drawing depicting an arrangement of interfaces of a gas distribution system in accordance with another embodiment, wherein the interfaces supply three gas mixtures from two gas sources and are arranged along each side of a sputtering target.

FIGS. 15 and 18 illustrates a gas distribution system 18 that includes a plurality of interfaces 62 that extend along a longitudinal axis LA of a target having a racetrack-shaped sputtering zone. The plurality of interfaces 62 are arranged along each side of the sputtering target. Each side includes first interfaces 62a, second interfaces 62b and third interfaces 62c. Each third interface 62 is sandwiched between a first interface 62a and a plurality of second interfaces 62b and thus serves as an intermediate or transitional interface. In particular, on each side, first interfaces 62a are provided as outermost interfaces that sandwich an intermediate interface 62c and a plurality of second interfaces 62b. The first interfaces 62a are positioned to supply a first gas mixture including an inert gas "y" to the turnaround areas 40, 44 of the racetrack-shaped sputtering zone. The second interfaces 62b are positioned supply a second gas mixture including an inert gas "x" to the straightaway areas 42, 46 of the racetrack-shaped sputtering zone. The third interfaces 62c are positioned to supply a third gas mixture including an inert gas "z" to the turnaround areas 40, 44 but are sandwiched in between the first interfaces 62a and the second interfaces 62b. For example, both the first interfaces 62a and the third interfaces 62c can be positioned adjacent the first turnaround area 40 along a longitudinal distance 48 and/or adjacent the second turnaround area 44 along a longitudinal distance 52. Also, the second interfaces 62b can be positioned adjacent the first straightaway area 42 and/or the second straightaway area 46 along a longitudinal distance 50.

Figure 16:
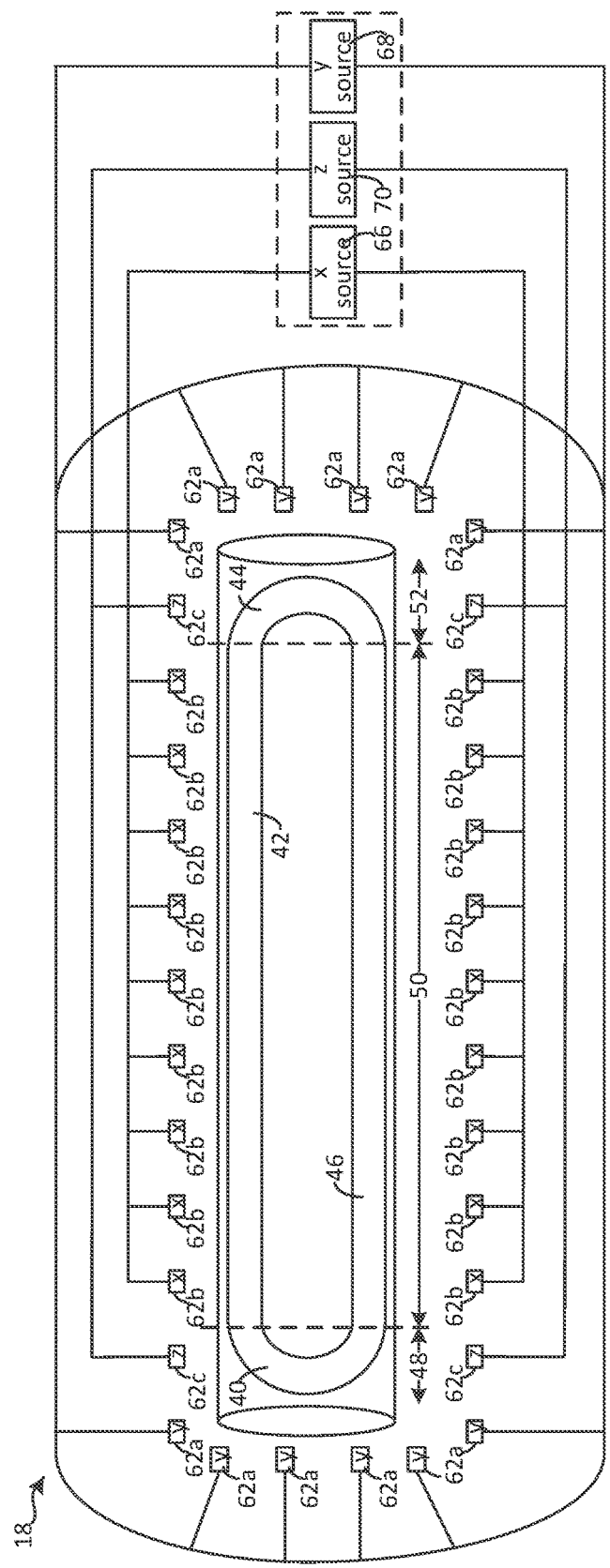
FIG. 16 is a schematic drawing depicting an arrangement of interfaces of a gas distribution system in accordance with another embodiment, wherein the interfaces supply three gas mixtures from a single gas source and are arranged to substantially entirely surround a sputtering target.
Figure 19:
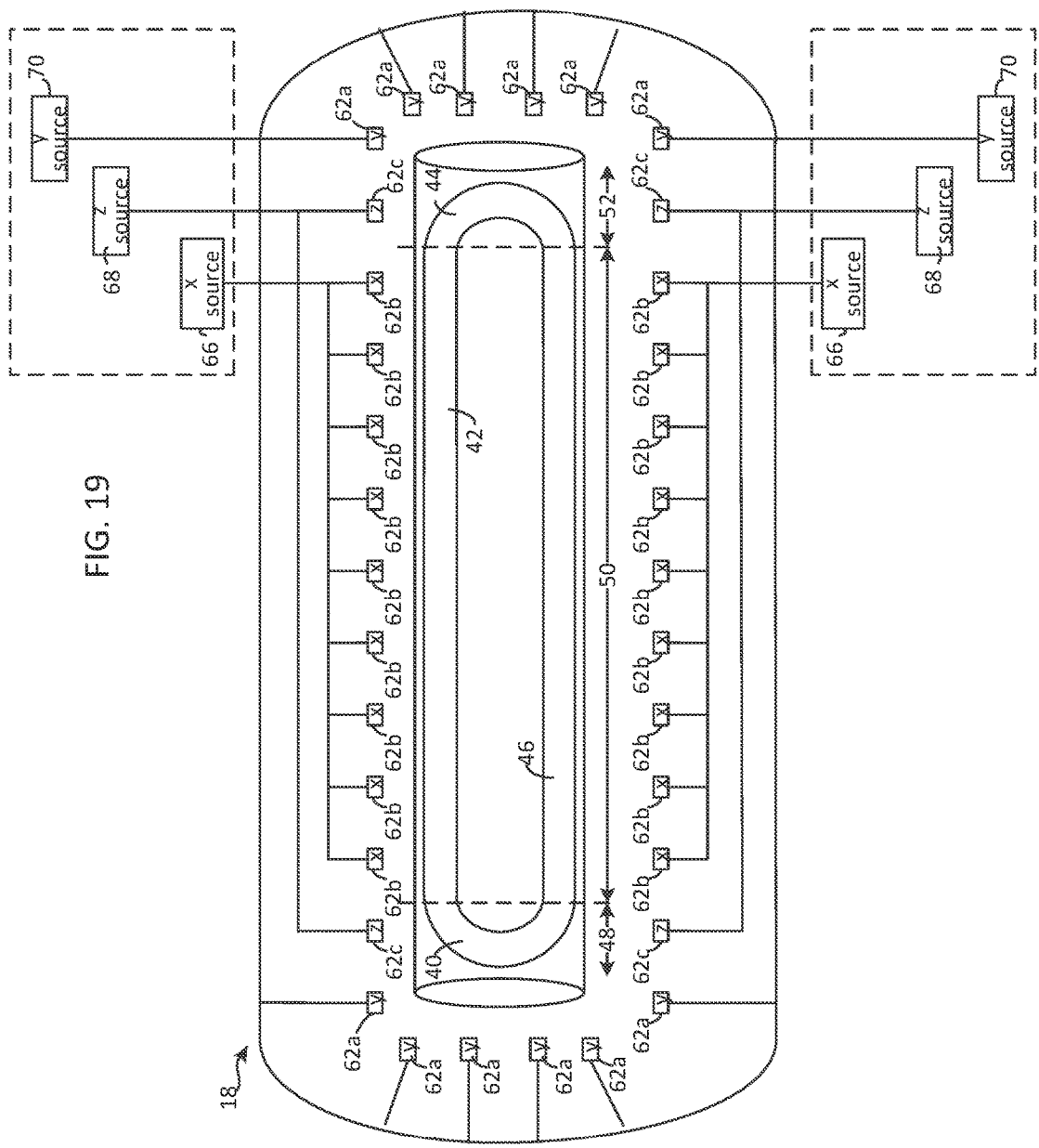
FIG. 19 is a schematic drawing depicting an arrangement of interfaces of a gas distribution system in accordance with another embodiment, wherein the interfaces supply three gas mixtures from two gas sources and are arranged to substantially entirely surround a sputtering target.

FIGS. 16 and 19 illustrates a gas distribution system 18 that includes a plurality of interfaces 62 that extend along a longitudinal axis LA of a target having a racetrack-shaped sputtering zone. The plurality of interfaces 62 are arranged to substantially entirely surround the target. In fact, in some cases, the plurality of interfaces 62 are also arranged as a racetrack shape that substantially entirely surrounds the racetrack-shaped sputtering zone 38. The interfaces 62 include first interface 62 as, second interfaces 62b and third interfaces 62c. Each third interface 62 is sandwiched between a first interface 62a and a plurality of second interfaces 62b and thus serves as an intermediate or transitional interface. The first interfaces 62a are positioned to supply a first gas mixture including an inert gas "y" to the turnaround areas 40, 44 of the racetrack-shaped sputtering zone. The second interfaces 62b are positioned supply a second gas mixture including an inert gas "x" to the straightaway areas 42, 46 of the racetrack-shaped sputtering zone. The third interfaces 62c are positioned to supply a third gas mixture including an inert gas "z" to the turnaround areas 40, 44 but are sandwiched in between the first interfaces 62a and the second interfaces 62b. The first interfaces 62a and the second interfaces 62c can be positioned adjacent to (e.g., by substantially surrounding) the first turnaround area 40 along a longitudinal distance 48 and/or adjacent to (e.g., by substantially surrounding) the second turnaround area 44 along a longitudinal distance 52. Also, the second interfaces 62b can be positioned adjacent the first straightaway area 42 and/or the second straightaway area 46 along a longitudinal distance 50.

Figure 17:
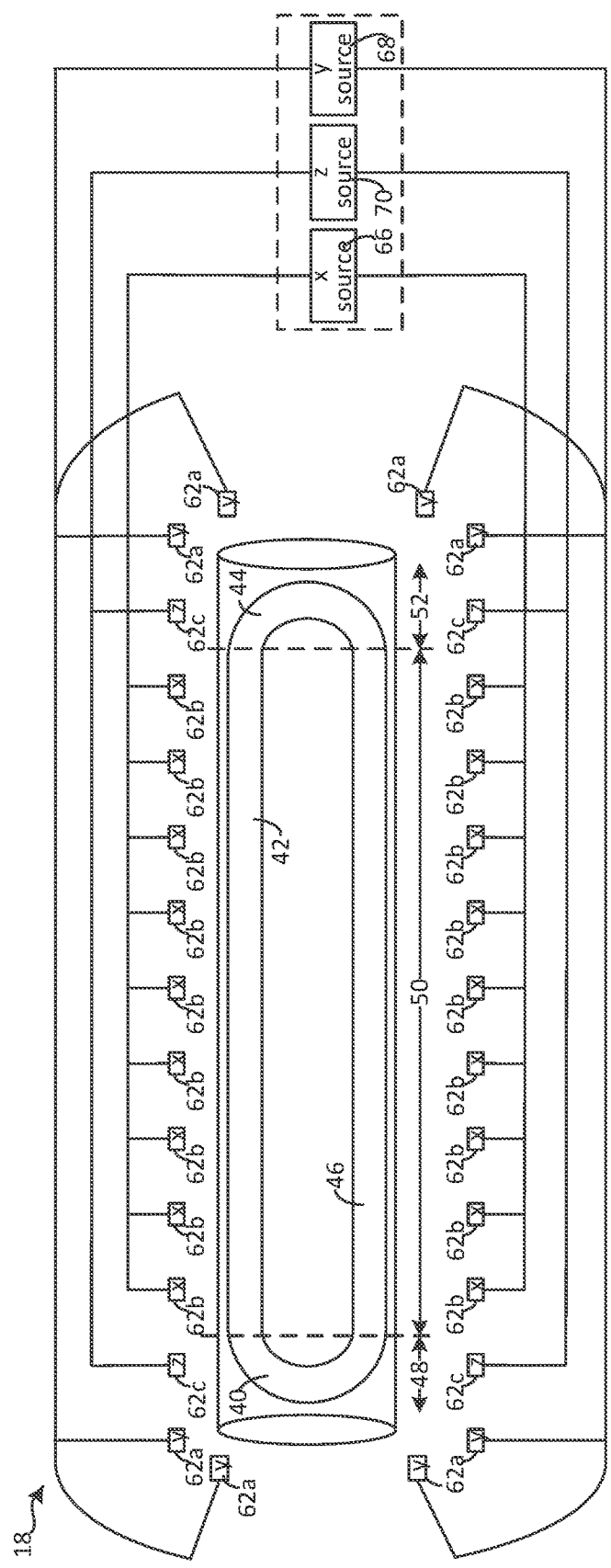
FIG. 17 is a schematic drawing depicting an arrangement of interfaces of a gas distribution system in accordance with another embodiment, wherein the interfaces supply three gas mixtures from a single gas source and are arranged along each side of a sputtering target and to partially surround ends of the sputtering target.
Figure 20:
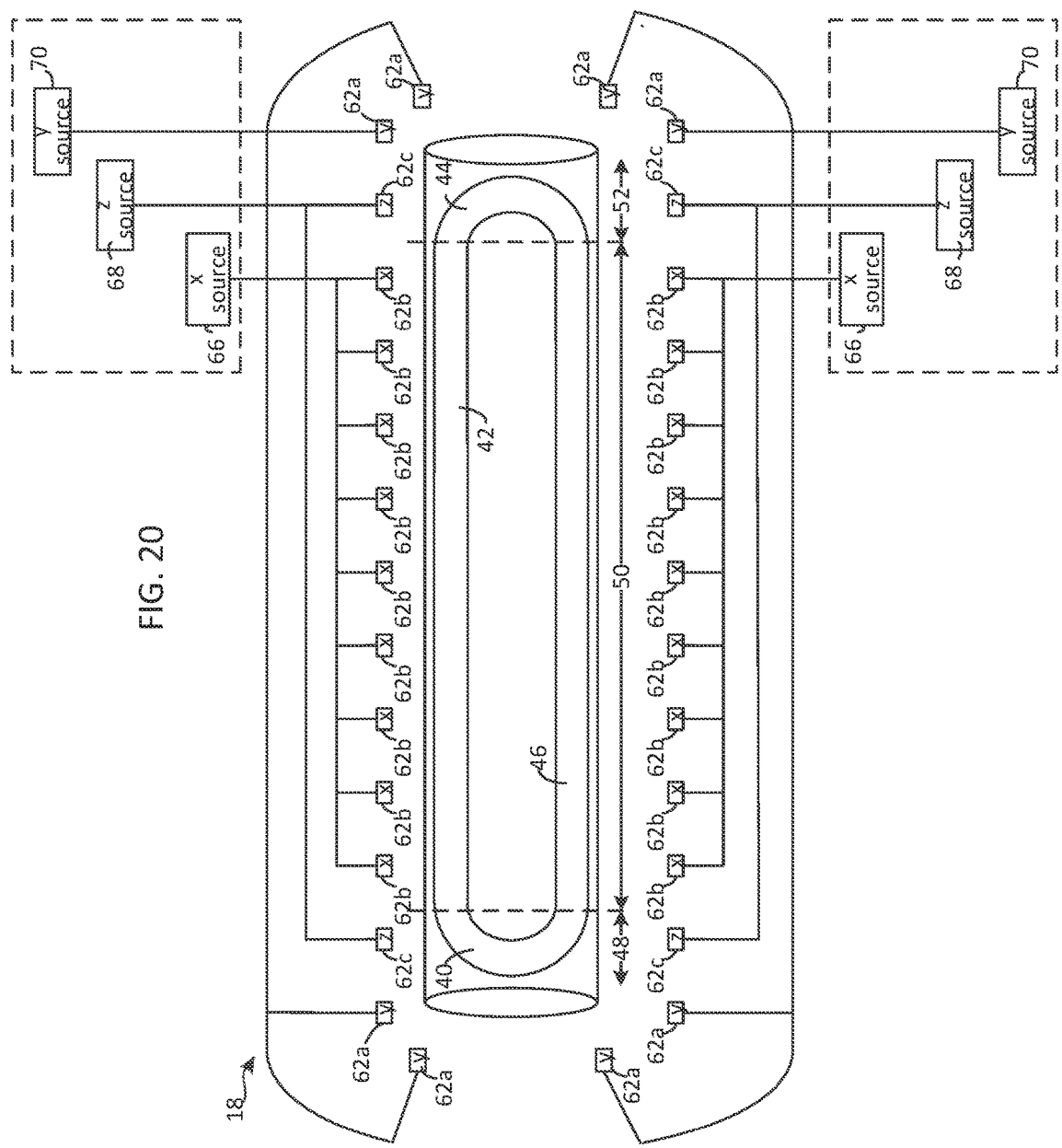
FIG. 20 is a schematic drawing depicting an arrangement of interfaces of a gas distribution system in accordance with another embodiment, wherein the interfaces supply three gas mixtures from two gas sources and are arranged along each side of a sputtering target and to partially surround ends of the sputtering target.

FIGS. 17 and 20 illustrates a gas distribution system 18 that includes a plurality of interfaces 62 that extend along a longitudinal axis LA of a target having a racetrack-shaped sputtering zone. The plurality of interfaces 62 are arranged along each side of the sputtering target. Each side of interfaces 62 also partially surrounds ends of the target. Again, the first interfaces 62a are positioned to supply a first gas mixture including an inert gas "y" to the turnaround areas 40, 44 of the racetrack-shaped sputtering zone. The second interfaces 62b are positioned supply a second gas mixture including an inert gas "x" to the straightaway areas 42, 46 of the racetrack-shaped sputtering zone. The third interfaces 62c are positioned to supply a third gas mixture including an inert gas "z" to the turnaround areas 40, 44 but are sandwiched in between the first interfaces 62a and the second interfaces 62b. Also, the first interfaces 62a and third interfaces 62c can be positioned adjacent to (e.g., by partially surrounding) the first turnaround area 40 along a longitudinal distance 68 and/or adjacent to (e.g., by partially surrounding) the second turnaround area 44 along a longitudinal distance 52. Also, the second interfaces 62b can be positioned adjacent the first straightaway area 42 and/or the second straightaway area 46 along a longitudinal distance 50.

In each of the embodiments of FIGS. 9-20, in some cases, the first gas mixture "y" includes a single inert gas selected from the group consisting of argon, helium neon, krypton, xenon and radon and the first atomic weight is an atomic weight of the single inert gas and/or the second gas mixture "x" includes a single inert gas selected from the group consisting of argon, helium neon, krypton, xenon and radon and the second atomic weight is an atomic weight of the single inert gas and/or the third gas mixture "z" includes a single inert gas selected from the group consisting of argon, helium neon, krypton, xenon and radon and the third atomic weight is an atomic weight of the single inert gas. In other cases, the first gas mixture "y" includes an inert gas mixture including two or more inert gases selected from the group consisting of argon, helium neon, krypton, xenon and radon and the first atomic weight is an average atomic weight of the two or more inert gases and/or the second gas mixture "x" includes an inert gas mixture including two or more inert gases selected from the group consisting of argon, helium neon, krypton, xenon and radon and the second atomic weight is an average atomic weight of the two or more inert gases and/or the third gas mixture "z" includes an inert gas mixture including two or more inert gases selected from the group consisting of argon, helium neon, krypton, xenon and radon and the third atomic weight is an average atomic weight of the two or more inert gases. In some cases, the first gas mixture "y" includes a reactive gas in addition to the inert gas and/or the second gas mixture "x" includes a reactive gas in addition to the inert gas and/or the third gas mixture "y" includes a reactive gas in addition to the inert gas.

In some embodiments, the gas distribution system 18 is used in a non-reactive sputtering process. In these embodiments, the gas distribution system 18 does not introduce reactive gases such as oxygen or nitrogen into the sputtering chamber. Instead, the gas distribution system 18 only introduces inert gases. In other words, the gas distribution system supplies gas that is free of or substantially free of a reactive gas. The non-reactive sputtering process can be either a non-reactive sputtering process for depositing metallic film or a non-reactive sputtering process for depositing dielectric film.

In certain embodiments, each the first gas mixture "y," the second gas mixture "x," and the third gas mixture "y" is substantially free of a reactive gas. For example, in some cases, the first gas mixture "y" consists essentially of or consists of a single inert gas selected from the group consisting of argon, helium neon, krypton, xenon and radon and the first atomic weight is an atomic weight of the single inert gas. The second gas mixture "x" consists essentially of or consists of a single inert gas selected from the group consisting of argon, helium neon, krypton, xenon and radon and the second atomic weight is an atomic weight of the single inert gas. The third gas mixture "z" consists essentially of or consists of a single inert gas selected from the group consisting of argon, helium neon, krypton, xenon and radon and the third atomic weight is an atomic weight of the single inert gas.

In other cases, the first gas mixture "y" consists essentially of or consists of an inert gas mixture including two or more inert gases selected from the group consisting of argon, helium neon, krypton, xenon and radon and the first atomic weight is an average atomic weight of the two or more inert gases. The second gas mixture "x" consists essentially of or consists of an inert gas mixture including two or more inert gases selected from the group consisting of argon, helium neon, krypton, xenon and radon and the second atomic weight is an average atomic weight of the two or more inert gases. The third gas mixture "z" consists essentially of or consists of an inert gas mixture including two or more inert gases selected from the group consisting of argon, helium neon, krypton, xenon and radon and the third atomic weight is an average atomic weight of the two or more inert gases.

In certain cases, the gas distribution system 18 is used with a sputtering target that includes sputterable material having a sputtering rate that is not modified by surface chemistry of the sputterable material. In certain embodiments, the gas distribution system 18 is used in a non-reactive sputtering process for depositing a metallic film such as metallic silver or metallic titanium. In these embodiments, the sputterable material in the sputtering target consists essentially of or consists of a metallic material such as metallic silver or metallic titanium. The gas distribution system 18 is used to sputter deposit a more uniform metallic film onto the substrate.

In some embodiments, the gas distribution system 18 includes a plurality of interfaces 62 that each introduces gas at the same or substantially the same pressure. For example, the interface that supplies the first gas mixture "y" will supply gas at the same or substantially the same pressure as the interface that supplies a second gas mixture "x."

In other embodiments, the plurality of interfaces 62 can include one or more interfaces that introduce gas continuously, for example at a continuous flow rate and/or at a continuous pressure. In some cases, all of the interfaces introduce gas continuously at the same flow rate. In other cases, certain of the interfaces introduce gas continuously at one flow rate whereas other interfaces introduce gas at another flow rate. Also, in some cases, all of the interfaces introduce gas continuously at the same pressure. In other cases, certain of the interfaces introduce gas continuously at one pressure whereas other interfaces introduce gas at another pressure.

In other embodiments, the plurality of interfaces 62 can include one or more interfaces that introduce gas non-continuously, for example by pulsing, such as by pulsing the flow rate or flow burst lengths and/or by pulsing the pressure. In some cases, all of the interfaces introduce gas by pulsing the flow rate or the flow burst lengths. In other cases, certain of the interfaces introduce gas continuously at one flow rate whereas other interfaces introduce gas by pulsing the flow rate or flow burst lengths. Also, in some cases, all of the interfaces introduce gas by pulsing the pressure. In other cases, certain of the interfaces introduce gas continuously at one pressure whereas other interfaces introduce gas by pulsing the pressure. Any desired combination of pulsing or non-pulsing can be provided to different arrangement of interfaces to help to adjust the local sputtering rates to help promote sputtering uniformity.

The plurality of interfaces 62 shown in FIGS. 9-20 can be provided as part of one or more gas delivery members. The gas delivery members can be configured as any desired structure that delivers gas through a plurality of interfaces. For example, the plurality of interfaces can be provided as part of the gas delivery member structure. Examples of gas delivery members include, but are not limited to, tubes, shafts, ducts, bars and beams. Likewise, the interfaces can be formed as manifolds, nozzles, openings or other structures that supply gas. The gas delivery members can also have one or more internal partitions (not shown) to ensure that different gas mixtures are separated and supplied to the appropriate interface.

Figure 3:
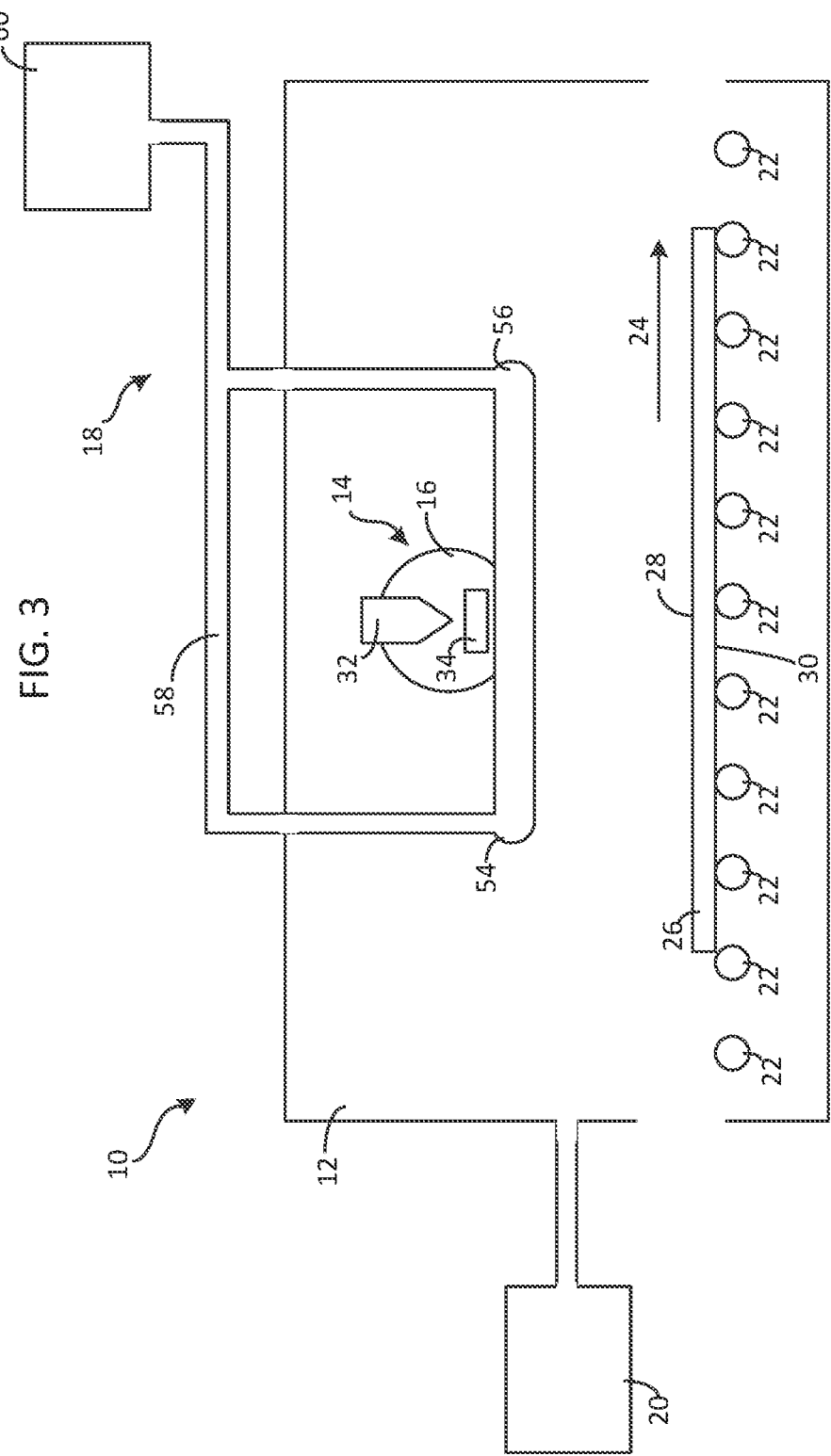
FIG. 3 is a schematic drawing depicting a magnetron sputtering system including a gas distribution system in accordance with another embodiment, wherein the gas distribution system includes a single gas delivery member positioned to substantially entirely surround a sputtering target and connected to a single gas source.
Figure 4:
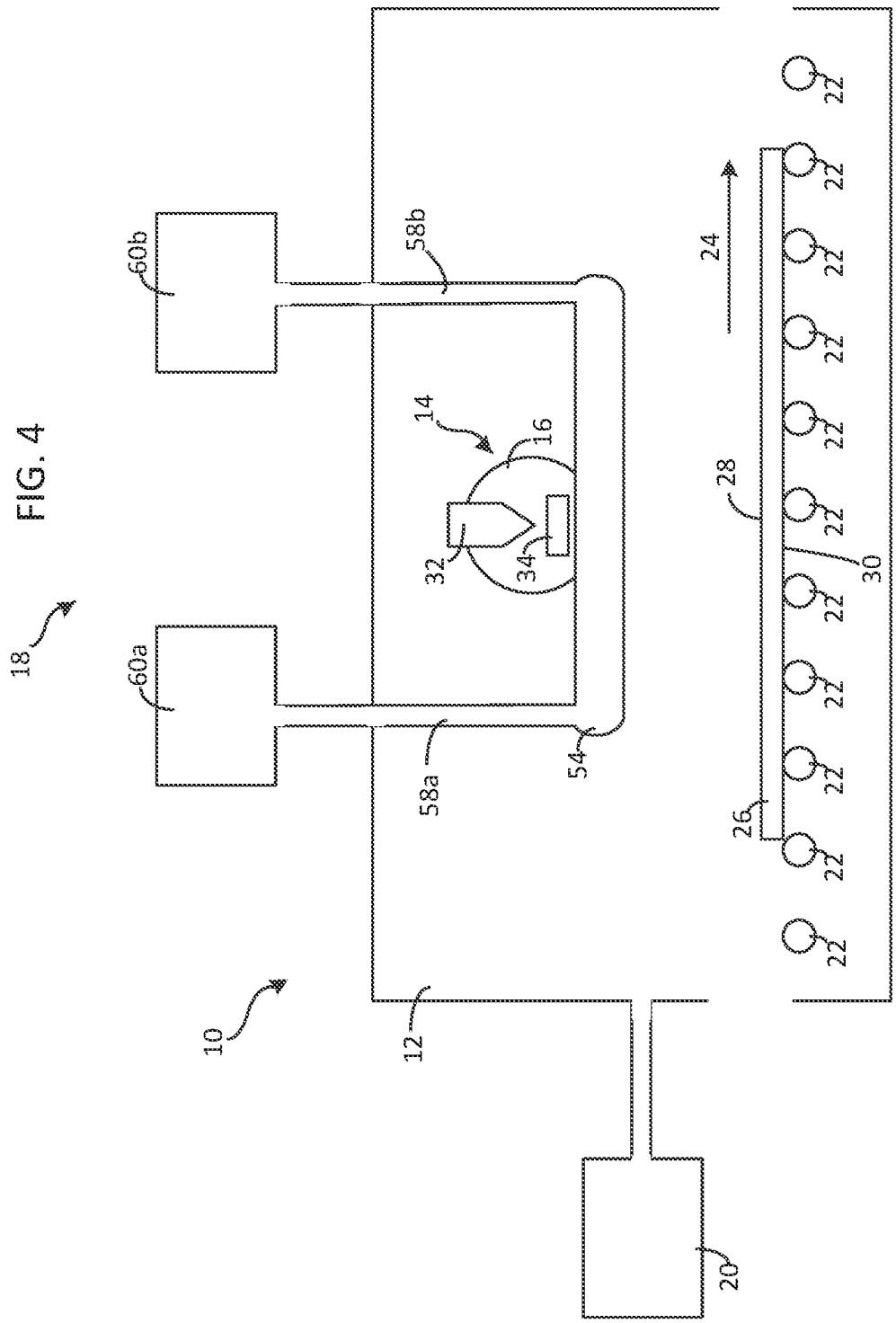
FIG. 4 is a schematic drawing depicting a magnetron sputtering system including a gas distribution system in accordance with another embodiment, wherein the gas distribution system includes a single gas delivery member positioned to substantially entirely surround a sputtering target and connected to two separate gas sources.
Figure 5:
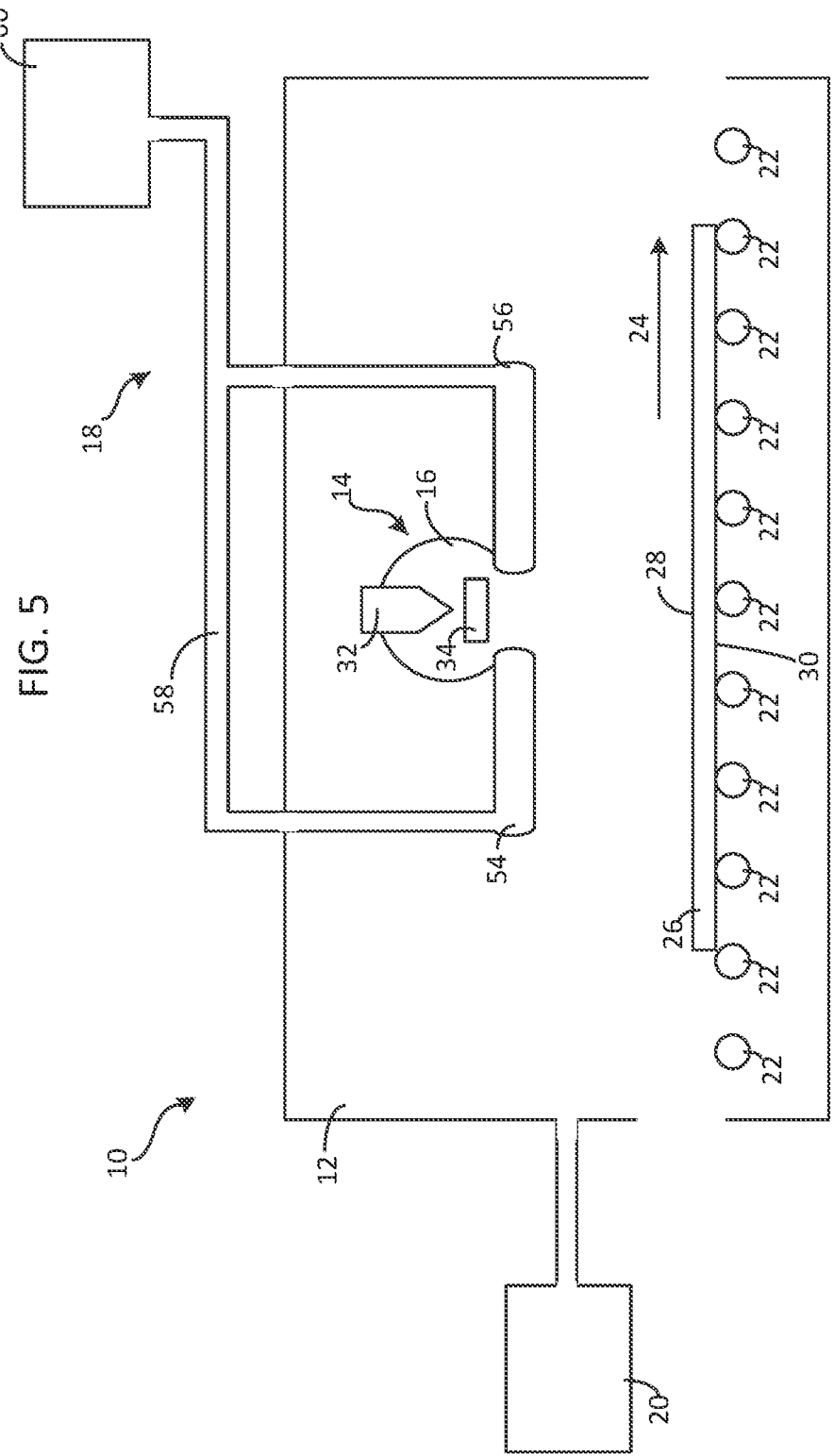
FIG. 5 is a schematic drawing depicting a magnetron sputtering system including a gas distribution system in accordance with another embodiment, wherein the gas distribution system includes two gas delivery members positioned on each side of a sputtering target and to partially surround ends of the sputtering target and connected to a single gas source.
Figure 6:
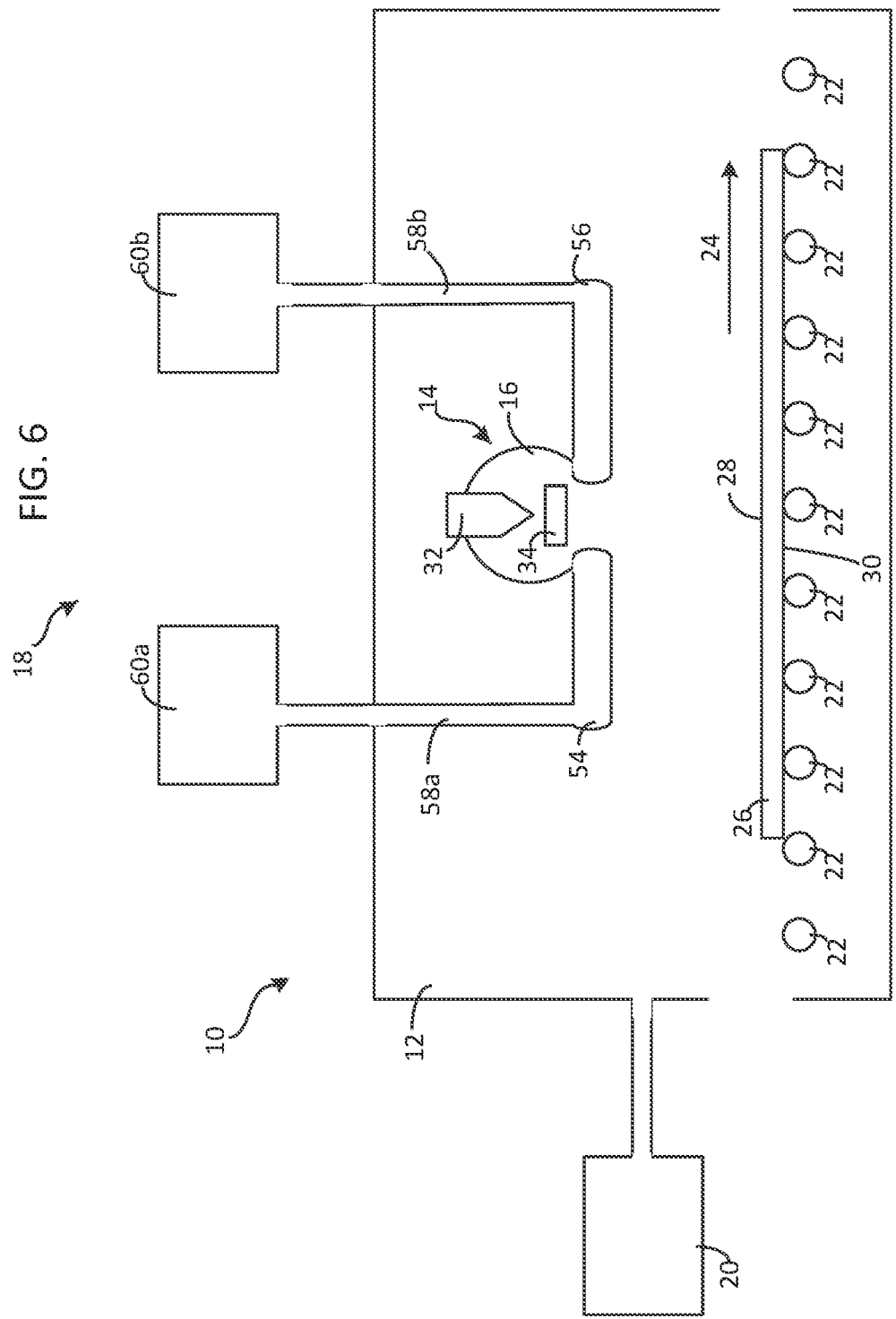
FIG. 6 is a schematic drawing depicting a magnetron sputtering system including a gas distribution system in accordance with another embodiment, wherein the gas distribution system includes two gas delivery members positioned on each side of a sputtering target and to partially surround ends of the sputtering target and connected to two separate gas sources.
Figure 21:
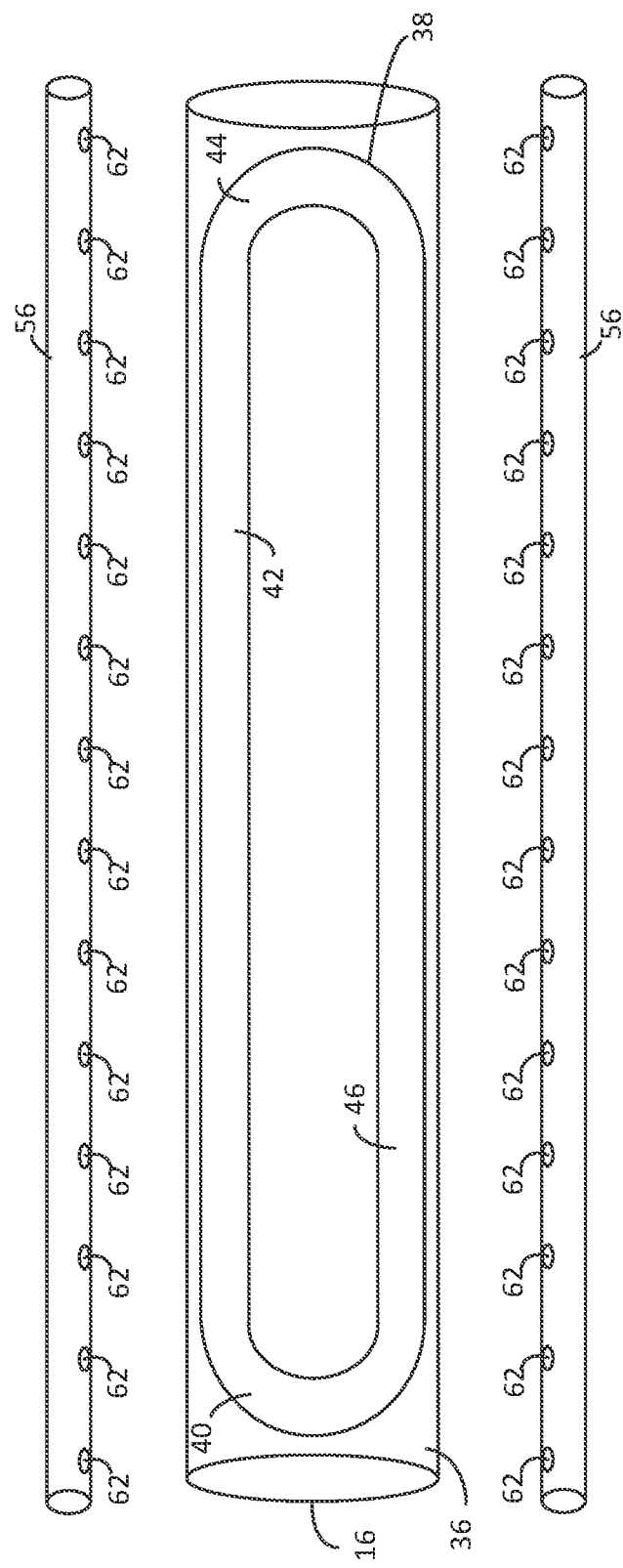
FIG. 21 is bottom view of a sputtering target and two gas distribution members of a gas distribution system in accordance with an embodiment, wherein each gas distribution member is positioned along each side of a sputtering target.
Figure 22:
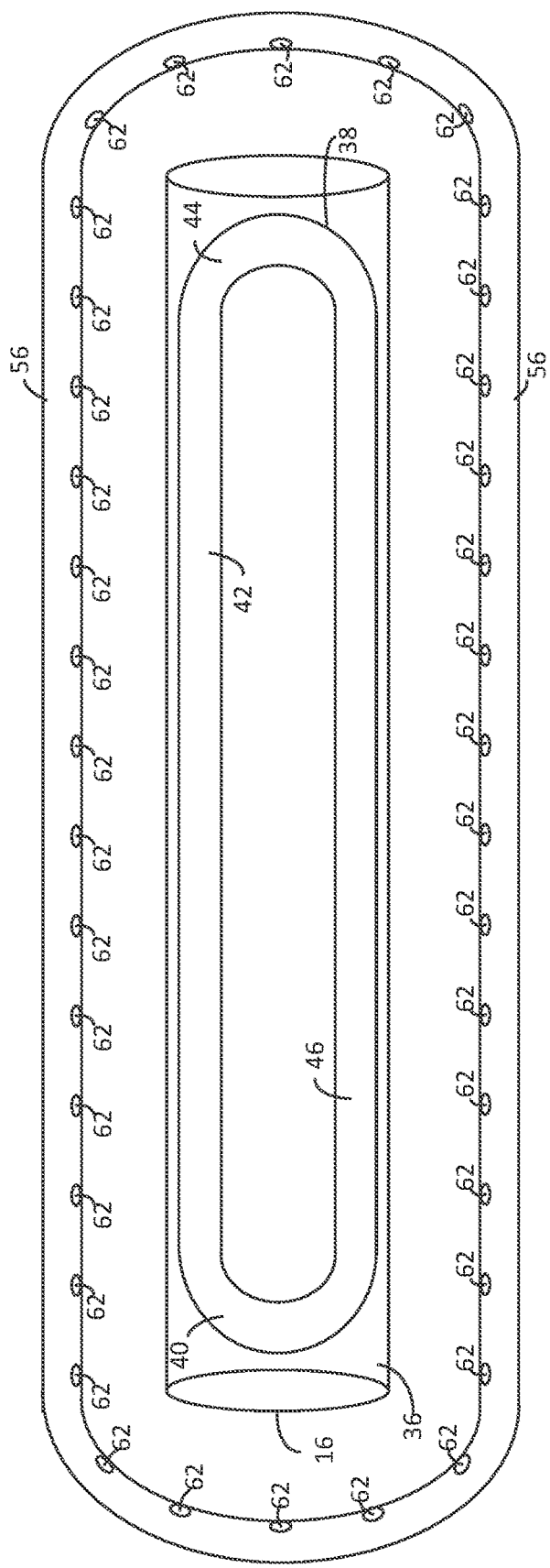
FIG. 22 is bottom view of a sputtering target and a single gas distribution member of a gas distribution system in accordance with an embodiment, wherein the single gas distribution member is positioned to substantially entirely surround the sputtering target.
Figure 23:
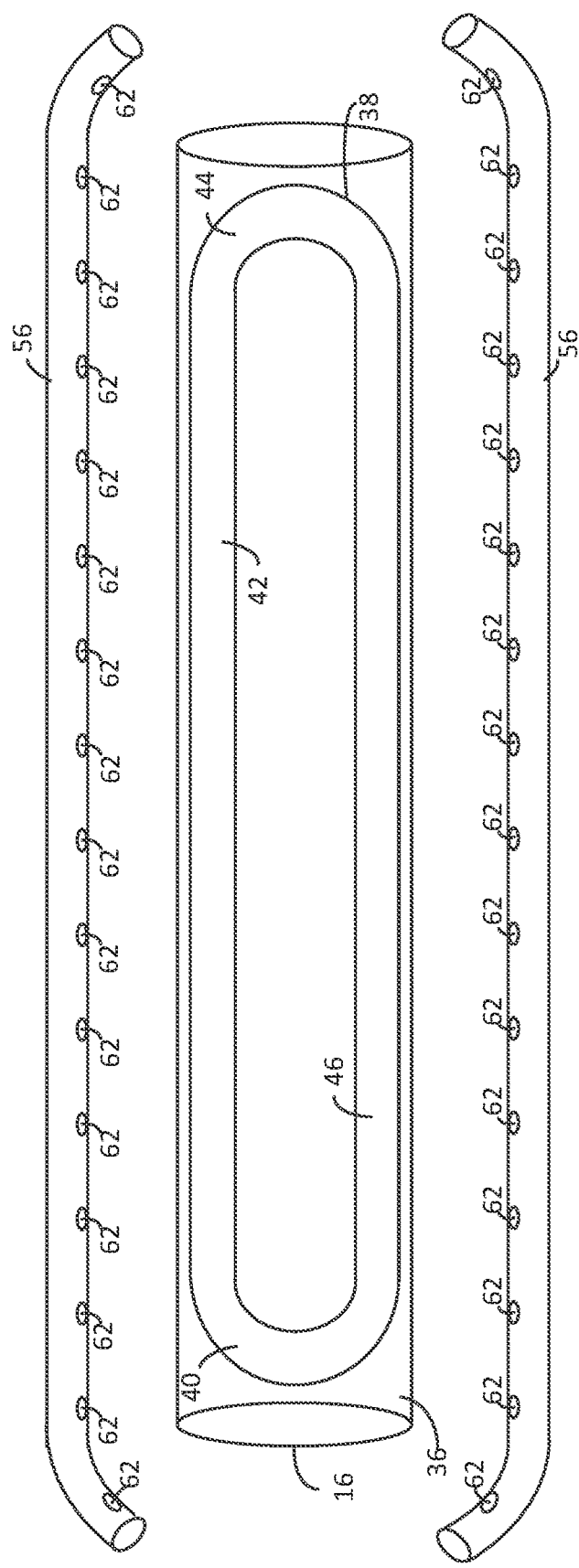
FIG. 23 is bottom view of a sputtering target and two gas distribution members of a gas distribution system in accordance with an embodiment, wherein each gas distribution member is positioned along each side of a sputtering target and to partially surround ends of the sputtering target.

In some embodiments, one or more gas delivery members are positioned along each side of a sputtering target. For example, in FIGS. 1-2 and 21, a first gas delivery member 54 is positioned on one side of the target 16 and a second gas delivery member 56 is positioned on an opposite side of the target. The gas delivery members of 54, 56 can include interfaces arranged according to any of the embodiments already described, for example the embodiments of FIG. 9, 12, 15 or 18. In FIGS. 3-4 and 22, a single gas delivery member 55 is provided and is positioned to substantially entirely surround the target 16. The single gas delivery member can include interfaces arranged according to any of the embodiments already described, for example the embodiments of FIG. 10, 13, 16 or 19. In FIGS. 5-6 and 23, a first gas delivery member 54 is positioned on one side of the target 16 and a second gas delivery member 56 is positioned on an opposite side of the target, wherein both gas delivery members 54, 56 also partially surround ends of the target. The gas delivery members of 54, 56 can include interfaces arranged according to any of the embodiments already described, for example the embodiments of FIG. 11, 14, 17 or 20.

Other embodiments of the invention provide a gas distribution system 18 having certain gas delivery members that are anodic. In such cases, the gas distribution system 18 includes a plurality gas distribution members, wherein the plurality of gas distribution members includes a plurality of anodic gas distribution members. Each anodic gas distribution member can be provided using principles and embodiments discussed in Applicant's own U.S. Pat. No. 7,166,199, the entire contents of which are herein incorporated by reference.

Each anodic gas distribution member is insulated from the other gas distribution members and from the grounded sputtering chamber. Applicant has discovered that by using a plurality of anodic gas distribution members, different voltages can be applied to different anodic gas distribution members to help control local sputtering rates. For example, when a higher voltage is supplied to an anodic gas distribution member, the higher voltage will collect more electrons from the local plasma to reduce the local sputtering rate.

In some cases, the gas distribution system 18 includes one or more anodic gas distribution members arrange so as to reduce the local sputtering rate at turnaround areas 40, 44 of a racetrack-shaped sputtering zone. As such, in some cases, the gas distribution system 18 includes at least one anodic gas distribution member, wherein the anodic gas distribution member is insulated from other gas distribution members and the sputtering chamber. The anodic gas distribution member supplies gas to either the first turnaround area 40 or the second turnaround area 44 and receives a voltage that reduces a local sputtering rate as compared to other gas distribution systems that are not anodic or that are anodic but receive a lower voltage.

A first anodic gas distribution member and a second anodic gas distribution member, wherein the first anodic gas distribution member is insulated from the second anodic gas distribution member, and wherein the first anodic gas distribution remember receives a first voltage and the second anodic gas distribution member receives a second voltage, wherein the first voltage is different than the second voltage.

Figure 24:
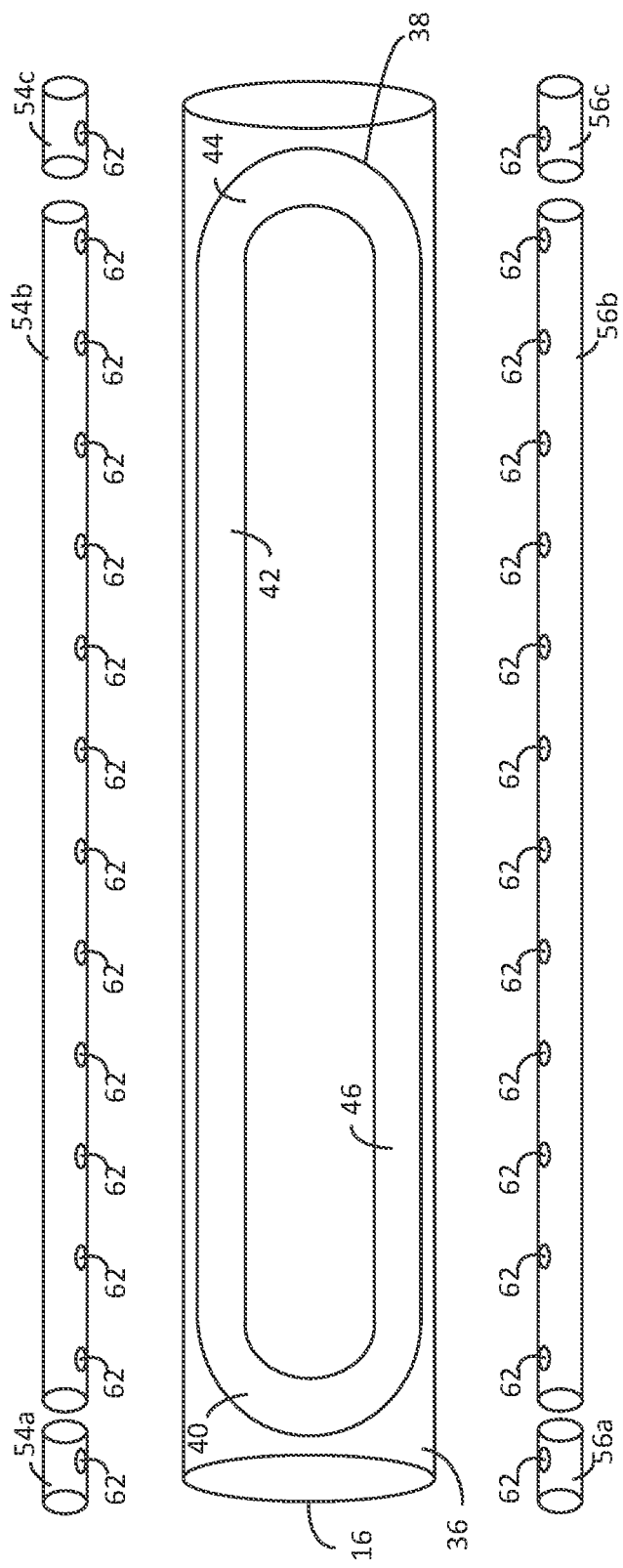
FIG. 24 is bottom view of a sputtering target and a plurality of gas distribution members of an anodic gas distribution system in accordance with an embodiment, wherein the gas distribution members are positioned along each side of a sputtering target and certain gas distribution members are anodic gas distribution members.

FIG. 24 illustrates one embodiment of a gas distribution system including anodic gas distribution members. A plurality of gas distribution members 54a, 54b and 54c are arranged along one side of a sputtering target and a plurality of gas distribution members 56a, 56b and 56c are arranged along an opposite side of the sputtering target. In some embodiments, gas distribution members 54a, 56a, 54c, 56c are anodic whereas gas distribution members 54b, 56b are not anodic. The anodic members 54a, 56a, 54c, 56c supply gas to turnaround areas 40, 44 of a racetrack-shaped sputtering zone. Preferably, the anodic members 54a, 56a, 54c, 56c are provided with a voltage that reduces the sputtering rate along the turnaround areas 40, 44 relative to the sputtering rate along the straightaway areas 42, 46.

In another embodiment, also shown in FIG. 24, all of the gas distribution members 54a, 54b, 54c, 56a, 56b, 56c are anodic. Here, the gas distribution members 54a, 56a, 54c, 56c receive a first voltage whereas gas distribution members 54b, 56b receive a second voltage, wherein the first voltage and the second voltage are different. In many cases, it is desirable to reduce the sputtering rate at the turnaround areas 40, 44 relative to the straightaway areas 42, 46, so the first voltage is higher than the second voltage.

In some cases, the gas delivery members shown in FIG. 24 can include the plurality of interfaces arrangement shown in either FIG. 9 or 12. In such cases, the gas delivery members 54a, 54c, 56a, 56c can include first interfaces 62a that supply a first gas mixture including an inert gas "y" and the gas delivery members 54b, 56c can include second interfaces 62b that supply a second gas mixture including an inert gas "x."

Figure 25:
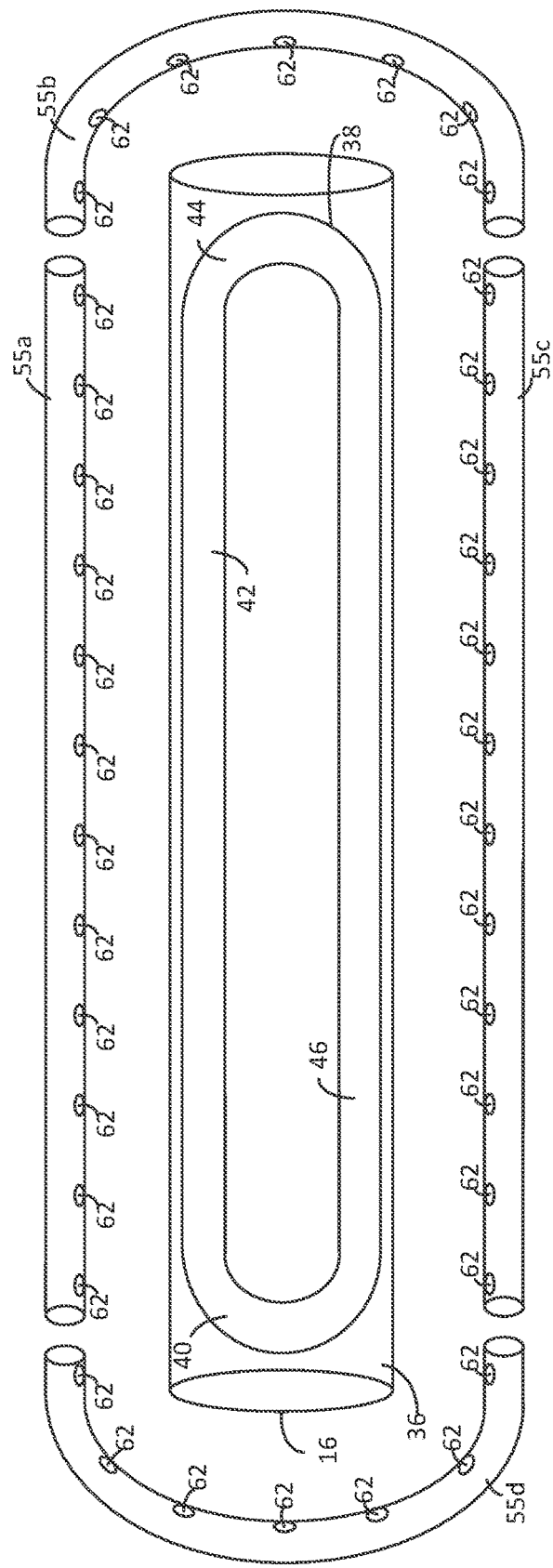
FIG. 25 is bottom view of a sputtering target and a plurality of gas distribution members of an anodic gas distribution system in accordance with an embodiment, wherein the gas distribution members are positioned to substantially entirely surround the sputtering target and certain gas distribution members are anodic gas distribution members.

FIG. 25 illustrates another embodiment of a gas distribution system including anodic gas distribution members. A plurality of gas distribution members 55a, 55b, 55c, 55d are arranged to substantially entirely surround a sputtering target. In some embodiments, gas distribution members 55b, 55d are anodic whereas gas distribution members 55a, 55c are not anodic. The anodic members 55b, 55d supply gas to turnaround areas 40, 44 of a racetrack-shaped sputtering zone whereas non-anodic members 55a, 55c supply gas to straightaway areas 42, 46. Preferably, the anodic members 55b, 55d are provided with a voltage that reduces the sputtering rate along the turnaround areas 40, 44 relative to the sputtering rate along the straightaway areas 42, 46.

In another embodiment, also shown in FIG. 25, all of the gas distribution members 55a, 55b, 55c, 55d are anodic. Here, the gas distribution members 55b, 55d receive a first voltage whereas gas distribution members 55a, 55c receive a second voltage, wherein the first voltage and the second voltage are different. In many cases, it is desirable to reduce the sputtering rate at the turnaround areas 40, 44 relative to the straightaway areas 42, 46, so the first voltage is higher than the second voltage.

Also, in some cases, the gas delivery members shown in FIG. 25 can include the plurality of interfaces arrangement shown in either FIG. 10 or 13. In such cases, the gas delivery members 55b, 55d can include first interfaces 62a that supply a first gas mixture including an inert gas "y" and the gas delivery members 55a, 55c can include second interfaces 62b that supply a second gas mixture including an inert gas "x."

Figure 26:
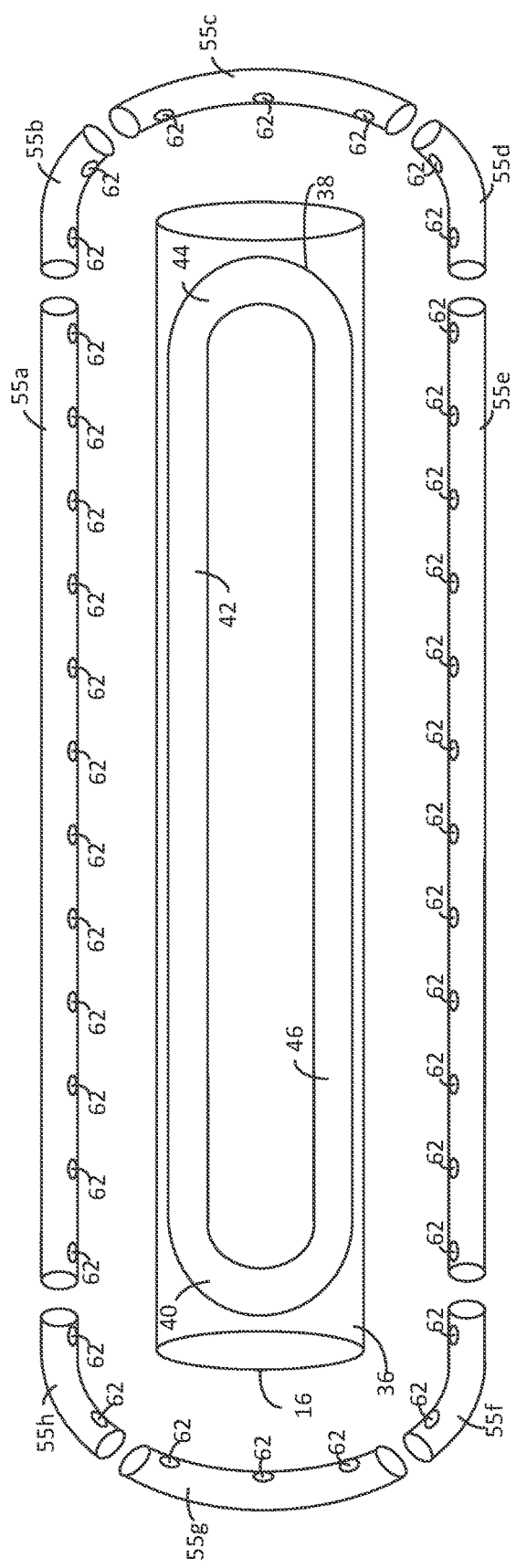
FIG. 26 is bottom view of a sputtering target and a plurality of gas distribution members of an anodic gas distribution system in accordance with an embodiment, wherein the gas distribution members are positioned to substantially entirely surround the sputtering target and certain gas distribution members are anodic gas distribution members.

FIG. 26 illustrates another embodiment of a gas distribution system including anodic gas distribution members. A plurality of gas distribution members 55a, 55b, 55c, 55d, 55d, 55e, 55f, 55g, 55h are arranged to substantially entirely surround a sputtering target. In some embodiments, gas distribution members 55b, 55c, 55d, 55e, 55f, 55g, 55h are anodic whereas gas distribution members 55a, 55e are not anodic. The anodic members 55b, 55c, 55d, 55e, 55f, 55g, 55h supply gas to turnaround areas 40, 44 of a racetrack-shaped sputtering zone whereas non-anodic members 55a, 55e supply gas to straightaway areas 42, 46. Preferably, the anodic members 55b, 55c, 55d, 55e, 55f, 55g, 55h are provided with a voltage that reduces the sputtering rate along the turnaround areas 40, 44 relative to the sputtering rate along the straightaway areas 42, 46. In particular embodiments, anodic members 55b, 55d, 55f, 55h receive a first voltage and anodic members 55c, 55g receive a second voltage. For example, the anodic members 55c, 55g can serve as transitional or intermediate anodic members that have a lower voltage than anodic members 55b, 55d, 55f, 55h. Thus, in some cases, the first voltage is higher than the second voltage.

In another embodiment, also shown in FIG. 26, all of the gas distribution members 55a, 55b, 55c, 55d, 55d, 55e, 55f, 55g, 55h are anodic. Here, the gas distribution members 55c, 55g receive a first voltage, gas distribution members 55b, 55e, 55f, 55h receive a second voltage and gas distribution members 55a, 55e receive a third voltage, wherein the first voltage, the second voltage and the third voltage are different. In many cases, the first voltage is higher than the second voltage and the second voltage is higher than the third voltage.

Also, in some cases, the gas delivery members shown in FIG. 26 can include the plurality of interfaces arrangement shown in either FIG. 16 or 19. In such cases, the gas delivery members 55c, 55g can include first interfaces 62a that supply a first gas mixture including an inert gas "y," the gas delivery members 55b, 55e, 55f, 55h can include third interfaces 62c that supply a third gas mixture including an inert gas "z" and the gas delivery members 55a, 55e include the second interfaces 62b that supply the second gas mixture "x."

Figure 27:
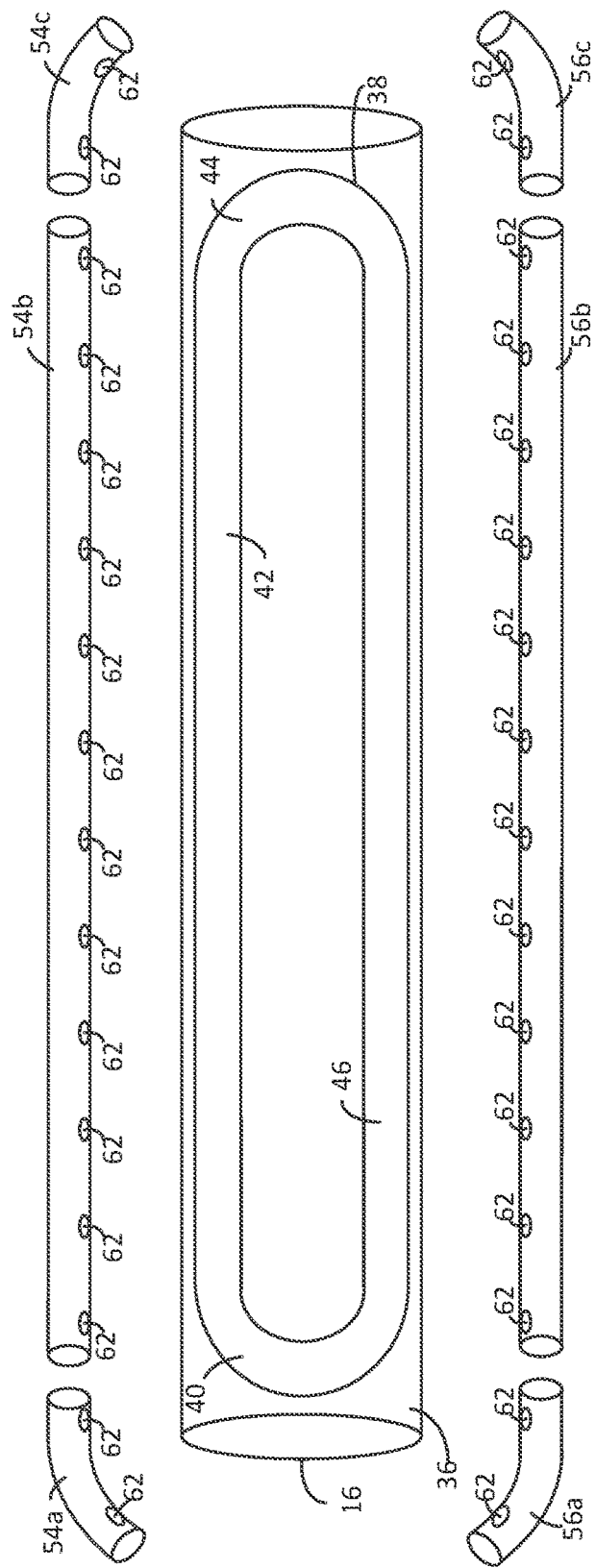
FIG. 27 is bottom view of a sputtering target and a plurality gas distribution members of an anodic gas distribution system in accordance with an embodiment, wherein the gas distribution members are positioned along each side of the sputtering target and to partially surround ends of the sputtering target and certain gas distribution members are anodic gas distribution members.

FIG. 27 illustrates another embodiment of a gas distribution system including anodic gas distribution members. A plurality of gas distribution members 54a, 54b and 54c are arranged along one side of a sputtering target and a plurality of gas distribution members 56a, 56b and 56c are arranged along an opposite side of the sputtering target. Also, gas distribution members 54a, 54c, 56a, 56c are arranged to partially surround ends of the sputtering target. In some embodiments, gas distribution members 54a, 56a, 54c, 56c are anodic whereas gas distribution members 54b, 56b are not anodic. The anodic members 54a, 56a, 54c, 56c supply gas to turnaround areas 40, 44 of a racetrack-shaped sputtering zone. Preferably, the anodic members 54a, 56a, 54c, 56c are provided with a voltage that reduces the sputtering rate along the turnaround areas 40, 44 relative to the sputtering rate along the straightaway areas 42, 46.

In another embodiment, also shown in FIG. 27, all of the gas distribution members 54a, 54b, 54c, 56a, 56b, 56c are anodic. Here, the gas distribution members 54a, 56a, 54c, 56c receive a first voltage whereas gas distribution members 54b, 56b receive a second voltage, wherein the first voltage and the second voltage are different. In many cases, it is desirable to reduce the sputtering rate at the turnaround areas 40, 44 relative to the straightaway areas 42, 46, so the first voltage is higher than the second voltage.

Also, in some cases, the gas delivery members shown in FIG. 27 can include the plurality of interfaces arrangement shown in either FIG. 11 or 14. In such cases, the gas delivery members 54a, 56a, 54c, 56c can include first interfaces 62a that supply a first gas mixture including an inert gas "y" and the gas delivery members 54b, 56b include the second interfaces 62b that supply the second gas mixture "x."

In each of the embodiments of FIGS. 24-27, each of the anodic members are insulated from other anodic members and non-anodic members. Each anodic member can be provided with a voltage from a single voltage source or a plurality of different voltage sources. Likewise, each voltage source(s) can be a set voltage or an adjustable voltage. Also, each of the anodic members can be provided with the same voltage or with different voltages. Even further, each of the anodic members can be provided with a continuous voltage or with a pulsed voltage. A pulsed voltage can be pulsed in voltage intensity and/or in voltage frequency. Any desired combination of set or adjustable voltages or pulsing or non-pulsing voltages can be provided to different arrangement of interfaces help to adjust the local sputtering rates to help promote sputtering uniformity.

Also, embodiments of the gas distribution system including one or more anodic gas delivery members can be used in combination with any of the embodiments of the gas distribution system including a plurality of interface arrangements. Any combination of any of the embodiments disclosed is within the scope of the invention.

While some preferred embodiments of the invention have been described, it should be understood that various changes, adaptations and modifications may be made therein without departing from the spirit of the invention and the scope of the appended claims.

What is claimed is:

1. A magnetron sputtering apparatus, comprising:
   a vacuum chamber providing a controlled environment;
   a cylindrical target comprising one or more sputterable materials, wherein the cylindrical target includes a sputtering zone that is racetrack shaped and extends longitudinally along a longitudinal axis, and the sputtering zone includes two straightaway areas sandwiched between first and second turnaround areas;
   a gas distribution system comprising a plurality of interfaces extending along the longitudinal axis, wherein the plurality of interfaces includes a plurality of first interfaces and a plurality of second interfaces, the first interfaces positioned at each of the first and second turnaround areas to supply a first gas mixture to both of the first and second turnaround areas, such that the first gas mixture controls sputtering rate at localized areas of both of the first and second turnaround areas, whereas the second interfaces are positioned at each of the two straightaway areas to supply a second gas mixture to both of the two straightaway areas, such that the second gas mixture controls sputtering rate at localized areas of both of the two straightaway areas, the first interfaces positioned along first and third longitudinal distances, the second interfaces positioned along a second longitudinal distance, such that the first, second, and third longitudinal distances do not overlap;
   wherein the first gas mixture is supplied to the first interfaces and the second gas mixture is supplied to the second interfaces, wherein the first gas mixture includes a single inert gas or two or more inert gases having a first atomic weight, and the second gas mixture includes a single inert gas or two or more inert gases having a second atomic weight, wherein the first atomic weight is an atomic weight of the single inert gas or an average atomic weight of the two or more inert gases in the first gas mixture and the second atomic weight is an atomic weight of the single inert gas or an average atomic weight of the two or more inert gases in the second gas mixture, and wherein the first atomic weight is different from the second atomic weight, the second atomic weight being heavier than the first atomic weight, the gas distribution system thereby providing more uniform sputtering rates across the first and second turnaround areas and the two straightaway areas than if only an argon gas atmosphere were provided to the first and second turnaround areas and the two straightaway areas, and wherein each of the first gas mixture and the second gas mixture is free of reactive gas.

2. The magnetron sputtering apparatus of claim 1 wherein the first gas mixture includes a single inert gas selected from the group consisting of argon, helium, neon, krypton, and xenon and the first atomic weight is an atomic weight of the single inert gas and/or the second gas mixture includes a single inert gas selected from the group consisting of argon, neon, krypton, xenon and radon and the second atomic weight is an atomic weight of the single inert gas.

3. The magnetron sputtering apparatus of claim 1 wherein at least one interface in the plurality of interfaces supplies gas at a continuous flow rate and/or at a continuous pressure.

4. The magnetron sputtering apparatus of claim 1 wherein the plurality of interfaces are part of a gas delivery member structure comprising one or more gas delivery members each positioned along a side of the cylindrical target.

5. The magnetron sputtering apparatus of claim 1 wherein the plurality of interfaces are part of a gas delivery member structure comprising a first gas delivery member positioned on a first side of the cylindrical target and a second gas delivery member positioned on an opposite side of the cylindrical target.

6. The magnetron sputtering apparatus of claim 1 wherein the first gas mixture is supplied to the first interfaces at a first gas pressure and the second gas mixture is supplied to the second interfaces at a second gas pressure, wherein the first gas pressure is substantially the same as the second gas pressure.

7. The magnetron sputtering apparatus of claim 1 wherein the gas distribution system includes an anodic gas distribution member that houses the first interfaces and receives a voltage that reduces a sputtering rate of the first turnaround area or the second turnaround area relative to a sputtering rate of the straightaway areas.

8. The magnetron sputtering apparatus of claim 1 wherein the first interfaces substantially surround at least a portion of the first turnaround area or the second turnaround area.

9. The magnetron sputtering apparatus of claim 1 wherein the plurality of interfaces further includes a third interface and a third gas mixture is supplied to the third interface and wherein the third gas mixture includes a single inert gas or two or more inert gases having a third atomic weight, wherein the third atomic weight is an atomic weight of the single inert gas or an average atomic weight of two or more inert gases and wherein the third atomic weight is different from each of the first atomic weight and the second atomic weight.

10. The magnetron sputtering apparatus of claim 9 wherein the second atomic weight is heavier than the first atomic weight and wherein the third atomic weight is heavier than the first atomic weight but lighter than the second atomic weight.

11. The magnetron sputtering apparatus of claim 9 wherein the first gas mixture is supplied to the first interfaces at a first gas pressure, the second gas mixture is supplied to the second interfaces at a second gas pressure and the third gas mixture is supplied to the third interface at a third gas pressure, wherein the first gas pressure, the second gas pressure and the third gas pressure are substantially the same.

12. The magnetron sputtering apparatus of claim 1 wherein the one or more sputterable materials of the cylindrical target comprise silver.

13. The magnetron sputtering apparatus of claim 1 wherein the one or more sputterable materials of the cylindrical target consist of silver.

* * * * *